US008502292B2

(12) United States Patent
Kato et al.

(10) Patent No.: US 8,502,292 B2
(45) Date of Patent: Aug. 6, 2013

(54) SEMICONDUCTOR DEVICE WITH MEMORY CELLS

(75) Inventors: Kiyoshi Kato, Kanagawa (JP); Takanori Matsuzaki, Kanagawa (JP); Shuhei Nagatsuka, Kanagawa (JP); Hiroki Inoue, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 132 days.

(21) Appl. No.: 13/182,488

(22) Filed: Jul. 14, 2011

(65) Prior Publication Data

US 2012/0012845 A1 Jan. 19, 2012

(30) Foreign Application Priority Data

Jul. 16, 2010 (JP) ................. 2010-162134

(51) Int. Cl.
*H01L 27/108* (2006.01)
*H01L 29/94* (2006.01)
(52) U.S. Cl.
USPC .......................................... 257/300
(58) Field of Classification Search
USPC ................................. 257/300, 351
See application file for complete search history.

(56) References Cited

U.S. PATENT DOCUMENTS

| | | | |
|---|---|---|---|
| 4,466,081 A | 8/1984 | Masuoka | |
| 5,731,856 A | 3/1998 | Kim et al. | |
| 5,744,864 A | 4/1998 | Cillessen et al. | |
| 6,127,702 A | 10/2000 | Yamazaki et al. | |
| 6,198,652 B1 | 3/2001 | Kawakubo et al. | |
| 6,294,274 B1 | 9/2001 | Kawazoe et al. | |
| 6,563,174 B2 | 5/2003 | Kawasaki et al. | |
| 6,570,206 B1 | 5/2003 | Sakata et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |

(Continued)

FOREIGN PATENT DOCUMENTS

| | | |
|---|---|---|
| CN | 101258607 A | 9/2008 |
| CN | 101859711 A | 10/2010 |

(Continued)

OTHER PUBLICATIONS

International Search Report, PCT Application No. PCT/JP2011/065746, Oct. 18, 2011, 4 pages.

(Continued)

*Primary Examiner* — William D Coleman
(74) *Attorney, Agent, or Firm* — Fish & Richardson P.C.

(57) ABSTRACT

A semiconductor device with a novel structure is provided, which can hold stored data even when no power is supplied and which has no limitations on the number of writing operations. A semiconductor device is formed using a material which enables off-state current of a transistor to be reduced significantly; e.g., an oxide semiconductor material which is a wide-gap semiconductor. With use of a semiconductor material which enables off-state current of a transistor to be reduced significantly, the semiconductor device can hold data for a long period. In a semiconductor device with a memory cell array, parasitic capacitances generated in the nodes of the first to the m-th memory cells connected in series are substantially equal, whereby the semiconductor device can operate stably.

9 Claims, 12 Drawing Sheets

U.S. PATENT DOCUMENTS

| | | |
|---|---|---|
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,074 B2 | 9/2010 | Iwasaki |
| 7,935,582 B2 | 5/2011 | Iwasaki |
| 7,956,361 B2 | 6/2011 | Iwasaki |
| 7,977,978 B2 * | 7/2011 | Yin et al. .............. 326/103 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0148171 A1 | 6/2010 | Hayashi et al. |
| 2010/0276689 A1 | 11/2010 | Iwasaki |
| 2010/0279462 A1 | 11/2010 | Iwasaki |
| 2011/0193082 A1 | 8/2011 | Iwasaki |

FOREIGN PATENT DOCUMENTS

| | | |
|---|---|---|
| EP | 1 737 044 A1 | 12/2006 |
| EP | 2 226 847 A2 | 9/2010 |
| EP | 2 339 639 A2 | 6/2011 |
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2000-156472 A | 6/2000 |
| JP | 2001-053167 A | 2/2001 |
| JP | 2001-203277 A | 7/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-103918 A | 4/2007 |
| JP | 2010-183108 A | 8/2010 |
| KR | 2008-0053355 A | 6/2008 |
| WO | 01/73846 A1 | 10/2001 |
| WO | 2004/114391 A1 | 12/2004 |
| WO | 2007/029844 A1 | 3/2007 |

OTHER PUBLICATIONS

Written Opinion, PCT Application No. PCT/JP2011/065746, dated Oct. 18, 2011, 4 pages.

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Backplane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID, 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh. H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04. : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancles in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5') Flexible Full Color Top Emission AMOLED Display on Plastic Film and its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N. et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperatures Over 1000° C," Journal of Solid State Chemistry, 1985, vol. 60, pp. 382-384.

Kimizuka, N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits, 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee. J et al., "World'S Largest (15-Inch) XGA AMLCD Panel Using IGZO Oxide TFT," SID Digest '08 : 34 SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-163.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-Ga2ZnO4-ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura. K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxides semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-24502-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In-Ga-Zn-Oxide TFTs With a Novel Passivation Layer," SID Digest '09 : SID International Symposium Digest of Technical Papers, May 31, 2009, pp. 284-287.

Soon-Moon Jung et al; "Highly Cost Effective and High Performance 65nm S3(Stacked Single-crystal Si) SRAM Technology with 25F2, 0.16um2Cell and Doubly Stacked SSTFT Cell Transistors for Ultra High Density and High Speed Applications"; 2005 Symposium on VLSI Technology Digest of Technical Papers; 2005; pp. 220-221.

Ishii, T et al., "A Poly-Silicon TFT With a Sub-5-nm Thick Channel for Low-Power Gain Cell Memory in Mobile Applications," IEEE Transactions on Electron Devices, Nov. 1, 2004, vol. 51, No. 11, pp. 1805-1810.

Kim, W et al., "An Experimental High-Density DRAM Cell with a Built-in Gain Stage," IEEE Journal of Solid State-Circuits, Aug. 1, 1994, vol. 29, No. 8, pp. 978-981.

Shukuri, S et al., "A Complementary Gain Cell Technology for Sub-1 V Supply DRAMs," IEDM 92: Technical Digest of International Electron Devices Meeting, Dec. 13, 1992, pp. 1006-1008.

Shukuri, S et al., "A Semi-Static Complementary Gain Cell Technology for Sub-1 V Supply DRAM's," IEEE Transactions on Electron Devices, Jun. 1, 1994, vol. 41, No. 6, pp. 926-931.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In-Ga-Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

* cited by examiner

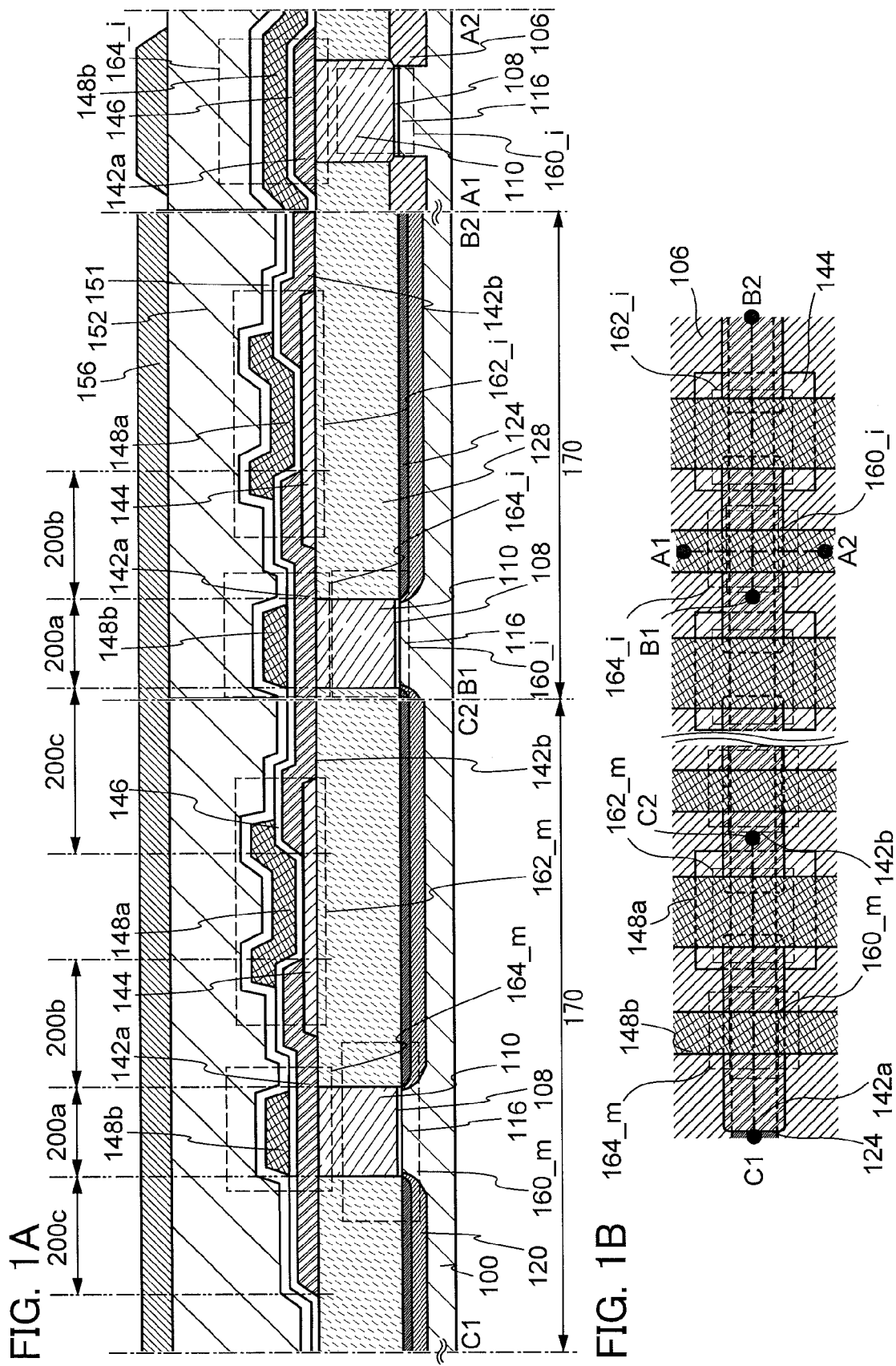

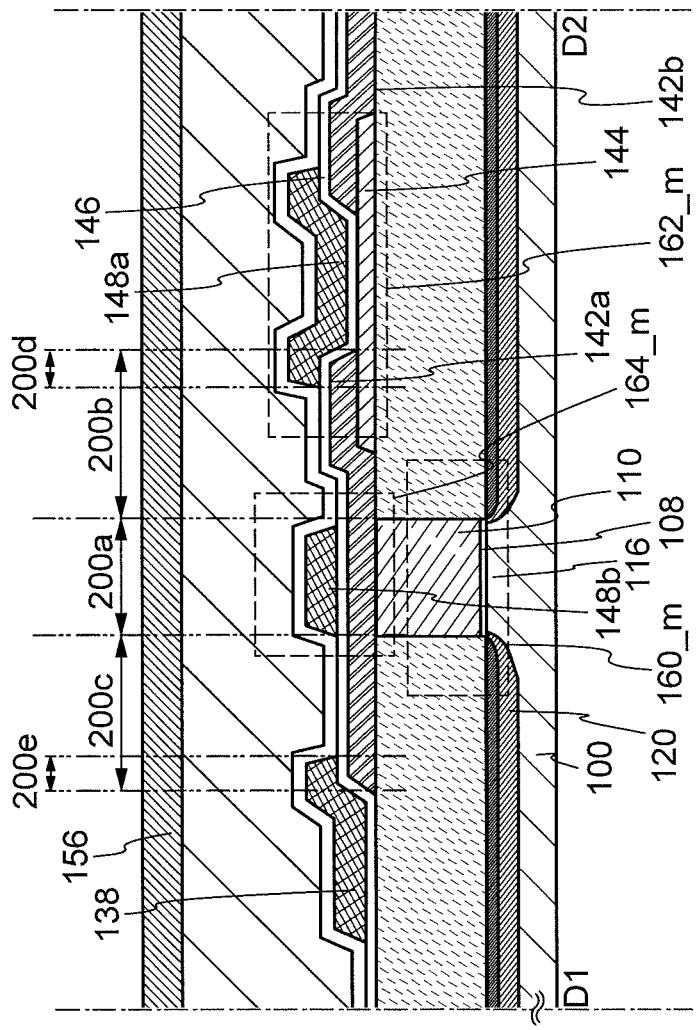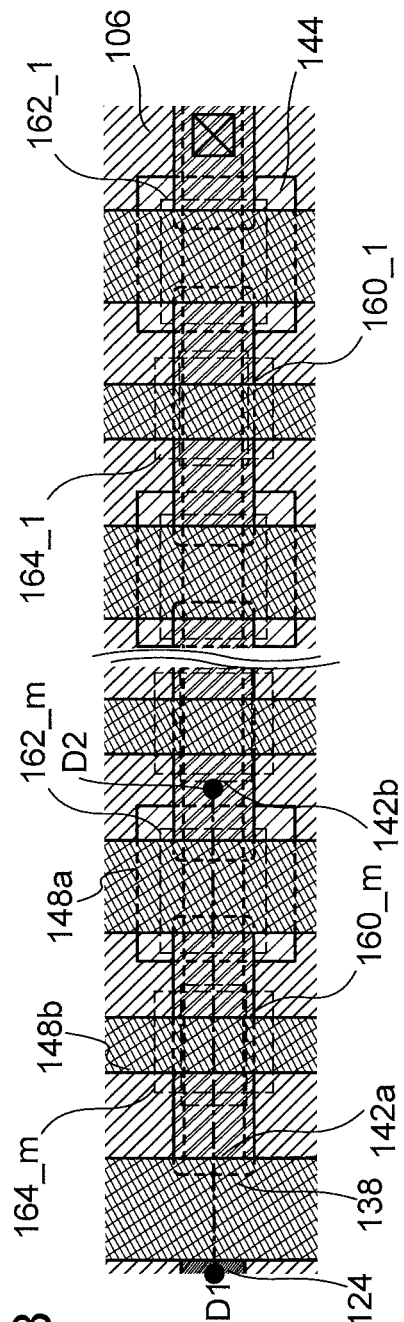

SEMICONDUCTOR DEVICE WITH MEMORY CELLS

TECHNICAL FIELD

The disclosed invention relates to a semiconductor device using a semiconductor element and a method for driving the semiconductor device.

BACKGROUND ART

Memory devices including semiconductor elements are broadly classified into two categories: volatile memory devices that cannot hold stored data when not powered, and nonvolatile memory devices that hold stored data even when not powered.

A typical example of volatile memory devices includes a DRAM (dynamic random access memory). A DRAM stores data in such a manner that a transistor included in a memory element is selected to store electric charge in a capacitor.

On the above-described principle, when data is read from a DRAM, charge in a capacitor is lost; thus, another writing operation is necessary every time data is read out. Moreover, since leakage current (off-state current) or the like flows between a source and a drain of a transistor included in a memory element when the transistor is in an off state, charge flows into or out even if the transistor is not selected, which makes a data holding period short. For this reason, another writing operation (refresh operation) is necessary at predetermined intervals, and it is difficult to sufficiently reduce power consumption. Furthermore, since stored data is lost when no power is supplied, an additional memory device using a magnetic material or an optical material is needed in order to hold the data for a long time.

Another example of volatile memory devices includes an SRAM (static random access memory). An SRAM retains stored data by using a circuit such as a flip-flop and thus does not need refresh operation. This means that an SRAM has an advantage over a DRAM. However, cost per storage capacity is increased because a circuit such as a flip-flop is used. Moreover, an SRAM is no different from a DRAM, in that stored data is lost when no power is supplied.

A typical example of non-volatile memory devices includes a flash memory. A flash memory includes a floating gate between a gate electrode and a channel formation region in a transistor and stores data by holding electric charge in the floating gate. Therefore, a flash memory has advantages in that the data holding period is extremely long (almost permanent) and refresh operation which is necessary for volatile memory devices is not needed (e.g., see Patent Document 1).

However, a gate insulating layer included in a memory element deteriorates by tunneling current generated at the time of a writing operation, so that the memory element fails to function because of a numerous number of writing operations. In order to avoid this problem, a method in which the number of writing operations for memory elements is equalized is employed, for example. However, complicated supplemental circuits are additionally needed to realize this method. Moreover, this method does not resolve the fundamental problem of lifetime. In other words, a flash memory is not suitable for applications in which data is frequently rewritten.

In addition, high voltage is needed for injecting electric charge into a floating gate or removing the electric charge therefrom, and a circuit therefor is required. Further, it takes a relatively long time to inject or remove electric charge, and it is not easy to perform writing and erasing at higher speed.

REFERENCE

Patent Document 1: Japanese Published Patent Application No. S57-105889

DISCLOSURE OF INVENTION

In view of the foregoing problems, an object of one embodiment of the invention disclosed herein is to provide a semiconductor device with a novel structure which can hold stored data even when no power is supplied and which has no limitations on the number of writing operations.

In the disclosed invention, a semiconductor device is formed using a material which enables off-state current of a transistor to be reduced significantly; for example, an oxide semiconductor material, which is a wide-gap semiconductor, is used. With use of a semiconductor material which enables off-state current of a transistor to be reduced significantly, the semiconductor device can hold data for a long period.

One embodiment of the present invention is a semiconductor device comprising m (m is an integer of 2 or more) write word lines, m read word lines, a bit line, a source line, a signal line and a first to an m-th memory cells connected in series between the bit line and the source line, and the first to the m-th memory cells each comprises a first transistor including a first gate electrode, a first source electrode, a first drain electrode and a first channel formation region; a second transistor including a second gate electrode, a second source electrode, a second drain electrode and a second channel formation region; and a capacitor, wherein the first channel formation region includes a semiconductor material different from a semiconductor material of the second channel formation region, wherein in each of the first to the m-th memory cells, the first gate electrode, either the second source electrode or the second drain electrode, and one electrode of the capacitor are electrically connected to form a node of which electric charges are held, and wherein a parasitic capacitance of the node included in the m-th memory cell is half of or more than half of a parasitic capacitance of the node included in an i (i is an integer of from 1 to (m−1))-th memory cell.

One embodiment of the present invention is a semiconductor device comprising m (m is an integer of 2 or more) write word lines, m read word lines, a bit line, a source line, a signal line and a first to an m-th memory cells connected in series between the bit line and the source line, and the first to the m-th memory cells each comprises a first transistor including a first gate electrode, a first source electrode, a first drain electrode and a first channel formation region; a second transistor including a second gate electrode, a second source electrode, a second drain electrode and a second channel formation region; and a capacitor, wherein the first channel formation region includes a semiconductor material different from a semiconductor material of the second channel formation region, wherein in each of the first to the m-th memory cells, the first gate electrode, either the second source electrode or the second drain electrode, and one electrode of the capacitor are electrically connected to form a node of which electric charges are held, and wherein parasitic capacitances of the nodes included in the first to the m-th memory cells are substantially equal.

One embodiment of the present invention is a semiconductor device comprising m (m is an integer of 2 or more) write word lines, m read word lines, a bit line, a source line, a signal line and a first to an m-th memory cells connected in series between the bit line and the source line, and the first to the m-th memory cells each comprises a first transistor including a first gate electrode, a first source electrode, a first drain electrode and a first channel formation region; a second transistor including a second gate electrode, a second source electrode, a second drain electrode and a second channel formation region; and a capacitor, wherein the first channel formation region includes a semiconductor material different from a semiconductor material of the second channel formation region, wherein the second transistor overlaps with at least a part of the first transistor with an insulating layer therebetween, wherein either the second source electrode or the second drain electrode is over and in contact with the first gate electrode, wherein either the second source electrode or the second drain electrode includes a first region in contact with the first gate electrode, a second region extending from the first gate electrode toward the second channel formation region, and a third region extending from the gate electrode to the side opposite to the second channel formation region, and wherein a parasitic capacitance between the third region and the first transistor in the m-th memory cell is substantially equal to a parasitic capacitance between the third region and the first transistor in an i (i is an integer of from 1 to (m−1))-th memory cell.

In any of the above-described semiconductor devices, lengths in a channel length direction of the second source electrodes in the first to the m-th memory cells are preferably equal.

In any of the above-described semiconductor devices, the second source electrode in the m-th memory cell may comprise a fourth region, which is a part of the second region and overlaps with the second gate electrode, and a fifth region, which is a part of the third region and overlaps with the source line. A parasitic capacitance between the fifth region and the source line is preferably substantially equal to a parasitic capacitance between the second source electrode in the (m−1)-th memory cell and the second gate electrode in the m-th memory cell.

In any of the above-described semiconductor devices, a length in a channel length direction of the fifth region is preferably equal to a length in a channel length direction of a region where the second source electrode in the (m−1)-th memory cell overlaps with the second gate electrode of the m-th memory cell.

In any of the above-described semiconductor devices, the first channel formation region may include silicon, and the second channel formation region may include an oxide semiconductor.

Note that although the transistor may be formed using an oxide semiconductor in any of the above-described semiconductor devices, the invention disclosed herein is not limited thereto. A material which can realize the off-state current characteristics equivalent to those of the oxide semiconductor, such as a wide gap material like silicon carbide (specifically, a semiconductor material whose energy gap Eg is larger than 3 eV) may be used.

Note that in this specification and the like, the term such as "on", "over" or "under", "below" does not necessarily mean that a component is placed "directly on" or "directly under" another component. For example, the expression "a gate electrode over a gate insulating layer" does not exclude a case where there is an additional component between the gate insulating layer and the gate electrode. Moreover, the terms such as "on", "over" or "under", "below" are used simply for convenience of explanation.

In addition, in this specification and the like, the term such as "electrode" or "wiring" does not limit a function of a component. For example, an "electrode" is sometimes used as part of a "wiring", and vice versa. In addition, the term "electrode" or "wiring" can also mean a combination of a plurality of "electrode" and "wiring", for example.

Functions of a "source" and a "drain" are sometimes replaced with each other when a transistor of opposite polarity is used or when the direction of current flowing is changed in circuit operation, for example. Therefore, the terms "source" and "drain" can be interchanged in this specification.

Further, in this specification etc., the terms relating to degrees such as "the same", "equivalent", "substantially equal", "equal", and the like are not limited to cases where certain conditions, numerical values, and the like are precisely identical, and the terms include reasonable deviation.

Note that the ordinal numbers such as "first" and "second" in this specification etc., are used for convenience and do not denote the order of steps or the stacking order of layers. In addition, the ordinal numbers in this specification do not denote particular names which specify the present invention. Additionally, these ordinal numbers are used in order to avoid confusion among components, and the terms do not limit the components numerically.

Since the off-state current of a transistor including an oxide semiconductor is extremely low, stored data can be held for an extremely long time by using the transistor. In other words, power consumption can be significantly reduced because refresh operation becomes unnecessary or the frequency of refresh operation can be extremely low. Moreover, stored data can be held for a long period even when no power is supplied (note that an electric potential is preferably fixed).

Further, a semiconductor device according to one embodiment of the disclosed invention does not need high voltage for writing of data and there is no problem of deterioration of elements. For example, unlike a conventional non-volatile memory, it is not necessary to inject and extract electrons into and from a floating gate, and thus a problem such as deterioration of a gate insulating layer does not occur at all. In other words, the semiconductor device according to one embodiment of the disclosed invention does not have a limit on the number of times of writing operations which is problematic in a conventional nonvolatile memory, and reliability thereof is drastically improved. Furthermore, data is written depending on the on state or the off state of the transistor, whereby high-speed operation can be easily realized. Also, the semiconductor device is advantageous because there is no need of operation for erasing data.

Since a transistor including a material other than an oxide semiconductor can operate at sufficiently high speed, the transistor is used in combination with a transistor including an oxide semiconductor, and thereby realizing sufficient high-speed performance in operation (e.g., reading data operation) of a semiconductor device. Further, the use of a transistor including a material other than an oxide semiconductor can favorably realize a variety of circuits (such as a logic circuit or a driver circuit) for high speed operation.

BRIEF DESCRIPTION OF DRAWINGS

In the accompanying drawings:

FIGS. 1A and 1B are a cross-sectional view and a plan view of a semiconductor device, respectively;

FIGS. 2A and 2B are a cross-sectional view and a plan view of a semiconductor device, respectively;

BEST MODE FOR CARRYING OUT THE INVENTION

Figure 3A:
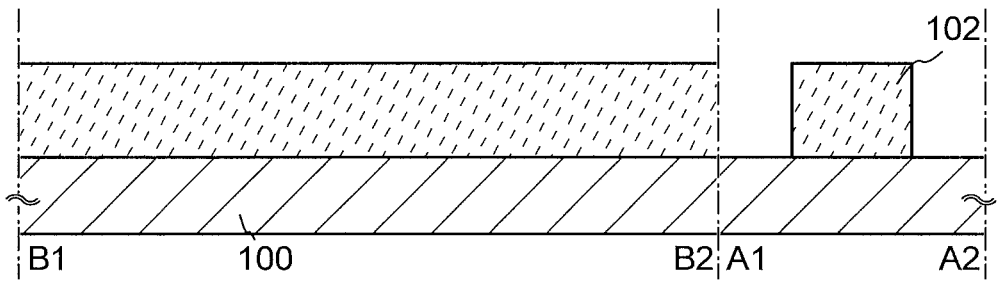
FIGS. 3A to 3D are cross-sectional views illustrating a manufacturing process of a semiconductor device.
Figure 3B:
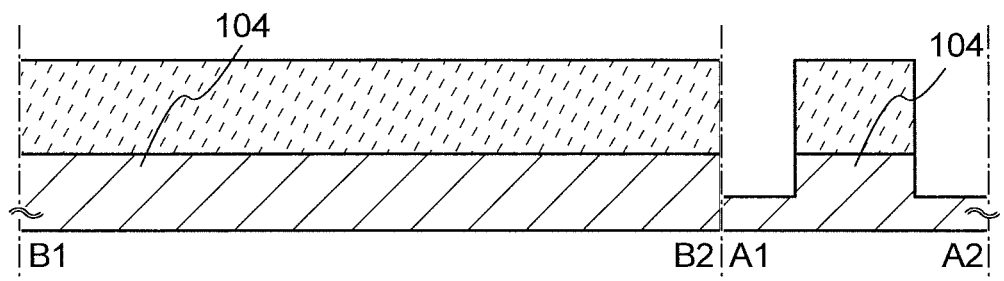

Hereinafter, embodiments of the present invention will be described with reference to the drawings. Note that the present invention is not limited to the following description and it will be readily appreciated by those skilled in the art that modes and details can be modified in various ways without departing from the spirit and the scope of the present invention. Therefore, the present invention should not be construed as being limited to the description in the following embodiments.

Note that the position, the size, the range, or the like of each structure illustrated in drawings and the like is not accurately represented in some cases for easy understanding. Therefore, the disclosed invention is not necessarily limited to the position, size, range, or the like disclosed in the drawings and the like.

Embodiment 1

In this embodiment, a circuit configuration and an operation according to one embodiment of the disclosed invention will be described with reference to drawings. Note that in some circuit diagrams, "OS" is written beside a transistor in order to indicate that the transistor includes an oxide semiconductor. In addition, a structure and a manufacturing method of a semiconductor device to which the circuit configuration is applied are described with reference to drawings.
<Basic Circuit>

First, a basic circuit configuration and an operation thereof will be described with reference to FIGS. 7A to 7C. In a semiconductor device illustrated in FIG. 7A, a first wiring (1st Line) is electrically connected to a source electrode (or a drain electrode) of a transistor 160. A second wiring (2nd Line) is electrically connected to the drain electrode (or the source electrode) of a transistor 160. A third wiring (3rd Line) is electrically connected to a source electrode (or a drain electrode) of a transistor 162. A fourth wiring (4th Line) is electrically connected to a gate electrode of the transistor 162. A gate electrode of the transistor 160 and the drain electrode (or the source electrode) of the transistor 162 are electrically connected to one electrode of a capacitor 164. A fifth wiring (5th Line) is electrically connected to the other electrode of the capacitor 164.

Here, a transistor including an oxide semiconductor is used as the transistor 162, for example. A transistor including an oxide semiconductor has a characteristic of a significantly small off-state current. For that reason, an electric potential of the gate electrode of the transistor 160 can be held for an extremely long period by turning off the transistor 162. Provision of the capacitor 164 facilitates holding of electric charge given to the gate electrode of the transistor 160 and reading of stored data.

Note that there is no particular limitation on the transistor 160. In terms of increasing the speed of reading data, it is preferable to use, for example, a transistor with high switching rate such as a transistor formed using single crystal silicon.

Figure 7A:
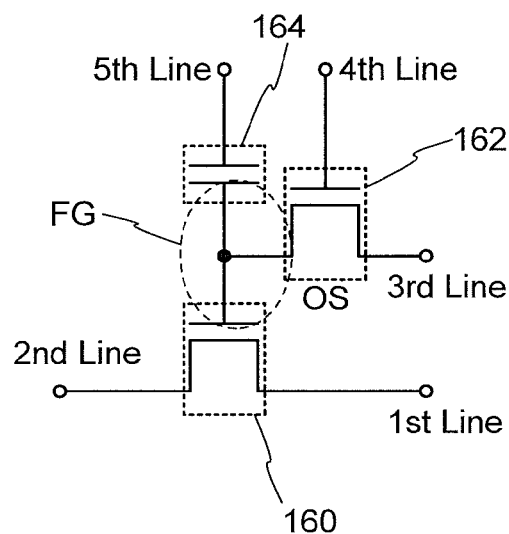
FIGS. 7A to 7C are each a circuit diagram of a semiconductor device.
Figure 7C:
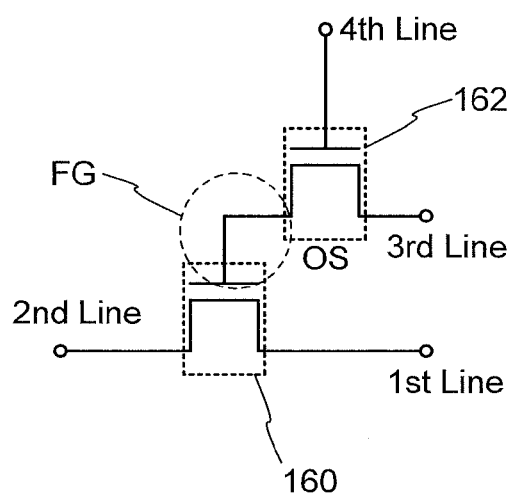

Alternatively, a structure in which the capacitor 164 is not provided is possible as illustrated in FIG. 7C.

The semiconductor device in FIG. 7A utilizes a characteristic in which the electric potential of the gate electrode of the transistor 160 can be held, and can thus write, hold, and read data as follows.

First of all, writing and holding of data will be described. First, the electric potential of the fourth wiring is set to an electric potential at which the transistor 162 is to be turned on, so that the transistor 162 is turned on. Accordingly, the electric potential of the third wiring is supplied to the gate electrode of the transistor 160 and the capacitor 164. That is, a predetermined charge is supplied to the gate electrode of the transistor 160 (writing operation). Here, one of two kinds of charges providing different electric potentials (hereinafter, a charge providing a low electric potential is referred to as charge $Q_L$ and a charge providing a high electric potential is referred to as charge $Q_H$) is applied. Note that three or more kinds of charges providing different electric potentials may be applied to improve storage capacity. After that, the electric potential of the fourth wiring is set to an electric potential at which the transistor 162 is to be turned off, so that the transistor 162 is turned off. Thus, the charge supplied to the gate electrode of the transistor 160 is held (holding operation).

Since the off-state current of the transistor 162 is significantly small, the charge of the gate electrode of the transistor 160 is held for a long time.

Next, reading operation of data will be described. By supplying an appropriate electric potential (reading electric potential) to the fifth wiring while supplying a predetermined electric potential (a constant electric potential) to the first wiring, the electric potential of the second wiring varies depending on the amount of charge held at the gate electrode of the transistor 160. This is generally because, when the transistor 160 is an n-channel transistor, an apparent threshold voltage $V_{th\_H}$ in the case where charge $Q_H$ is supplied to the gate electrode of the transistor 160 is lower than an apparent threshold voltage $V_{th\_L}$ in the case where charge $Q_L$ is supplied to the gate electrode of the transistor 160. Here, an apparent threshold voltage refers to the electric potential of the fifth wiring, which is needed to turn on the transistor 160. Thus, the electric potential of the fifth wiring is set to an electric potential $V_0$ intermediate between $V_{th\_H}$ and $V_{th\_L}$, whereby charge given to the gate electrode of the transistor 160 can be determined. For example, in the case where charge $Q_H$ is supplied in writing operation, when the electric potential of the fifth wiring is set to $V_0$ ($>V_{th\_H}$), the transistor 160 is turned on. In the case where the charge $Q_L$ is applied in writing operation, even when the electric potential of the fifth wiring is $V_0$ ($<V_{th\_L}$), the transistor 160 remains off. Therefore, the data held can be read by measuring the electric potential of the second wiring.

Note that when memory cells are arrayed, it is necessary that only data of a desired memory cell can be read. The following cases may be employed so that data of a desired memory cell is read and data of the other memory cells is not read. In a case where the transistors 160 are connected in parallel, fifth wirings in memory cells that are not a target for reading operation are supplied with an electric potential at which the transistors 160 are turned off regardless of the state of the gate electrodes, that is, an electric potential lower than $V_{th\_H}$. On the other hand, in a case where the transistors 160 are connected in series, fifth wirings in memory cells that are not a target for reading operation are supplied with an electric potential with which the transistors 160 are turned on regardless of a state of the gate electrodes, that is, an electric potential higher than $V_{th\_L}$.

Next, rewriting operation of data will be described. Rewriting of data is performed in a manner similar to that of the writing and holding of data. In other words, the electric potential of the fourth wiring is set to an electric potential at which the transistor 162 is to be turned on, so that the transistor 162 is turned on. Accordingly, the electric potential of the third wiring (an electric potential for new data) is supplied to the gate electrode of the transistor 160 and the capacitor 164. After that, the electric potential of the fourth wiring is set to an electric potential at which the transistor 162 is to be turned off, so that the transistor 162 is turned off. In this manner, charge for new data is supplied to the gate electrode of the transistor 160.

In the semiconductor device according to one embodiment of the disclosed invention, data can be directly rewritten by another data writing operation as described above. Therefore, extraction of charge from a floating gate with use of high voltage which is necessary for a flash memory or the like is not needed, and thus a decrease in operation speed due to erasing operation can be suppressed. In other words, high-speed operation of the semiconductor device can be realized.

Note that the drain electrode (or the source electrode) of the transistor 162 is electrically connected to the gate electrode of the transistor 160 and therefore has a function similar to that of a floating gate of a floating gate transistor used as a non-volatile memory element. A portion where the drain electrode (or the source electrode) of the transistor 162 and the gate electrode of the transistor 160 are electrically connected to each other is called a node FG in some cases. When the transistor 162 is turned off, the node FG can be regarded as being embedded in an insulator and thus charge is held at the node FG. The off-state current of the transistor 162 including an oxide semiconductor is smaller than or equal to 1/100000 of the off-state current of a transistor including a silicon semiconductor or the like; thus, loss of the charge accumulated in the node FG due to leakage in the transistor 162 is negligible. That is, with the transistor 162 including an oxide semiconductor, a nonvolatile memory device which can hold data without being supplied with power can be realized.

For example, when the off-state current of the transistor 162 at room temperature (25° C.) is 10 zA (1 zA (zeptoampere) is $1 \times 10^{-21}$ A) or less and the capacitance value of the capacitor 164 is approximately 10 fF, data can be held at least for $10^4$ seconds or longer. Needless to say, the holding period depends on transistor characteristics and capacitance.

Further, the semiconductor device according to one embodiment of the disclosed invention does not have the problem of deterioration of a gate insulating film (tunnel insulating film), which is problematic in a conventional floating gate transistor. That is, the deterioration of a gate insulating film due to injection of electrons into a floating gate, which has been problematic, can be solved. This means that there is no limit on the number of write cycles in principle. Furthermore, high voltage needed for writing or erasing operation in a conventional floating gate transistor is not necessary.

Figure 7B:
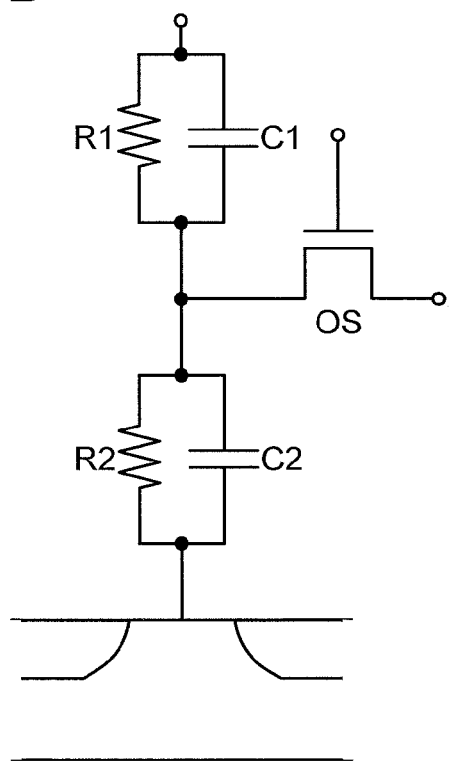

Components such as transistors in the semiconductor device in FIG. 7A can be regarded as including resistors and capacitors as illustrated in FIG. 7B. That is, in FIG. 7B, the transistor 160 and the capacitor 164 are each regarded as including a resistor and a capacitor. R1 and C1 denote the resistance and the capacitance of the capacitor 164, respectively. The resistance R1 corresponds to the resistance of the insulating layer included in the capacitor 164. R2 and C2 denote the resistance and the capacitance of the transistor 160, respectively. The resistance R2 corresponds to the resistance of the gate insulating layer when the transistor 160 is turned on. The capacitance C2 corresponds to a so-called gate capacitance (capacitance formed between the gate electrode and the source or drain electrode, and capacitance foamed between the gate electrode and the channel formation region).

A charge holding period (also referred to as a data holding period) is determined mainly by the off-state current of the transistor 162, under the conditions where the gate leakage current of the transistor 162 is sufficiently small and R1 and R2 satisfy $R1 \geqq ROS$ and $R2 \geqq ROS$, where ROS is the resistance (also referred to as effective resistance) between the source electrode and the drain electrode in the off-state of the transistor 162.

On the other hand, in the case where the above conditions are not satisfied, it is difficult to secure a sufficient holding period even if the off-state current of the transistor 162 is sufficiently small. This is because a leakage current other than the off-state current of the transistor 162 (e.g., a leakage current generated between the source electrode and the gate electrode of the transistor 160) is large. Accordingly, it can be said that it is preferable that the semiconductor device disclosed in this embodiment satisfies the relationships of $R1 \geqq ROS$ and $R2 \geqq ROS$.

Meanwhile, it is preferable that C1 and C2 satisfies the relation of $C1 \geqq C2$. This is because if C1 becomes large, when the electric potential of the node FG is controlled by the fifth wiring, the electric potential of the fifth wiring can be efficiently supplied to the node FG and the difference between electric potentials supplied to the fifth wiring (e.g., a reading electric potential and a non-reading electric potential) can be kept small.

When the above relationships are satisfied, a more favorable semiconductor device can be realized. Note that R1 and R2 depend on the gate insulating layer of the transistor 160 and the insulating layer of the capacitor 164. The same applies to C1 and C2. Therefore, the material, the thickness, and the like of the gate insulating layer are preferably set as appropriate to satisfy the above relationships.

In the semiconductor device described in this embodiment, the node FG has a function similar to that of a floating gate of a floating gate transistor of a flash memory or the like, but the node FG of this embodiment has a feature which is essentially different from that of the floating gate of the flash memory or the like.

In a flash memory, since a high electric potential is applied to a control gate, it is necessary to keep a proper distance between cells in order to prevent the electric potential of the control gate from affecting a floating gate of an adjacent cell. This is one factor of inhibition of higher integration of the semiconductor device. The factor is attributed to a basic principle of a flash memory, in which a tunneling current is generated by applying a high electric field.

On the other hand, the semiconductor device according to this embodiment is operated by switching of a transistor including an oxide semiconductor and does not use the above-described principle of charge injection by a tunneling current. That is, a high electric field for charge injection is not necessary, unlike a flash memory. Accordingly, it is not necessary to consider an influence of a high electric field from a control gate on an adjacent cell, and this facilitates an increase in the degree of integration.

In addition, the semiconductor device according to this embodiment is advantageous over a flash memory also in that a high electric field is not necessary and a large peripheral circuit (such as a step-up circuit) is not necessary. For example, the highest voltage applied to the memory cell according to this embodiment (the difference between the highest electric potential and the lowest electric potential applied to respective terminals of the memory cell at the same time) can be 5 V or less, preferably 3 V or less, in each memory cell when data of two level (one bit) is written.

In a case where the relative permittivity ∈r1 of the insulating layer included in the capacitor 164 is different from the relative permittivity ∈r2 of the insulating layer included in the transistor 160, it is easy to satisfy C1≧C2 while satisfying 2·S2≧S1 (preferably, S2≧S1) where S1 is the area of the insulating layer included in the capacitor 164 and S2 is the area of the insulating layer constituting a gate capacitance in the transistor 160. In other words, the relation of C1≧C2 is easily realized while the area of the insulating layer included in the capacitor 164 is made small. Specifically, for example, a film including a high-k material such as hafnium oxide or a stack of a film including a high-k material such as hafnium oxide and a film including an oxide semiconductor is used for the insulating layer included in the capacitor 164 so that ∈r1 can be set to 10 or more, preferably 15 or more, and silicon oxide is used for the insulating layer constituting a gate capacitance so that ∈r2 can be set to 3 to 4.

Combination of such structures enables higher integration of the semiconductor device according to one embodiment of the disclosed invention.

Note that in addition to the increase in the degree of integration, a multilevel technique can be employed in order to increase the storage capacity of the semiconductor device. For example, three or more levels of data are written to one memory cell, whereby the storage capacity can be increased as compared to that in the case where two-level (one bit) data is written. The multilevel technique can be achieved by, for example, giving another charge Q to the gate electrode of the transistor 160, in addition to the charge $Q_L$ for supplying a low electric potential and the charge $Q_H$ for supplying a high electric potential. In this case, sufficient storage capacity can be ensured even in a circuit configuration with a relatively large scale (e.g., 15 $F^2$ to 50 $F^2$; F is the minimum feature size).

Application Example

Next, a more specific circuit structure to which the circuit illustrated in FIGS. 7A to 7C is applied and an operation thereof will be described with reference to FIG. 8 and FIGS. 9A to 9C.

Figure 8:
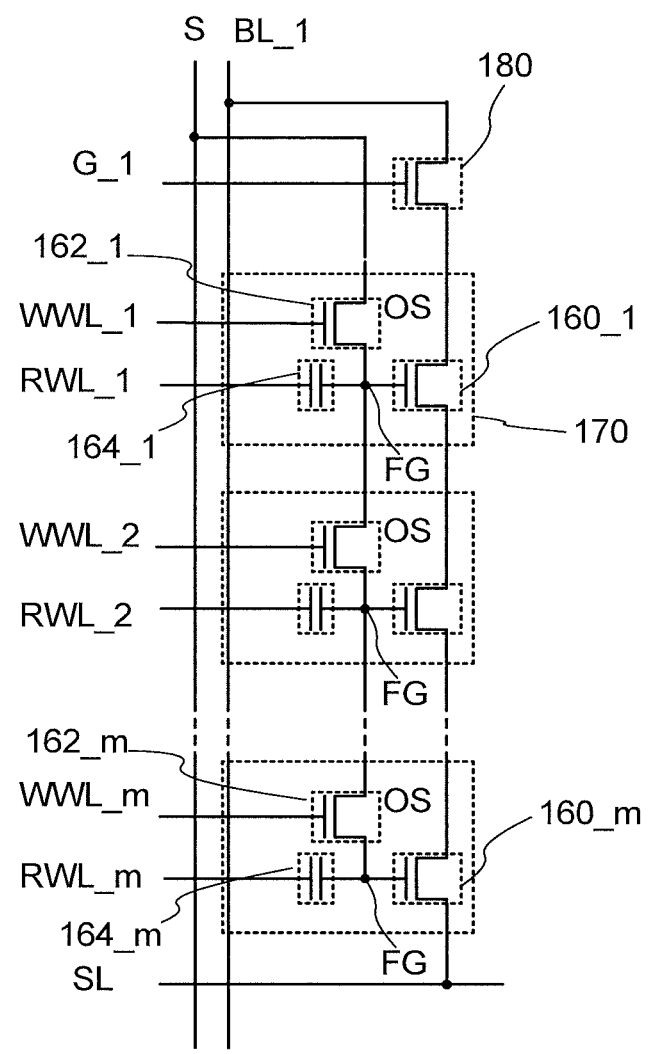
FIG. 8 is a circuit diagram of a semiconductor device.

A semiconductor device illustrated in FIG. 8 is an example of a circuit diagram of a semiconductor device including m memory cells 170. The structure of the memory cells 170 in FIG. 8 is similar to that in FIG. 7A. That is, the first wiring in FIG. 7A corresponds to a bit line 13L in FIG. 8; the second wiring in FIG. 7A, a source line SL in FIG. 8; the third wiring in FIG. 7A, a signal line S in FIG. 8; the fourth wiring in FIG. 7A, a write word line WWL in FIG. 8; and the fifth wiring in FIG. 7A, a read word line RWL in FIG. 8. FIG. 8 is a circuit diagram of a so-called NAND type semiconductor device in which the memory cells 170 are connected in series between the bit line BL and the source line SL. In the configuration of FIG. 8, the bit line BL and the drain electrode of the transistor 160 included in the memory cell 170 of the first row are electrically connected to each other via a selection transistor 180. A gate electrode of the selection transistor 180 is electrically connected to a selection line G to switch on or off the selection transistor 180. In addition, only the memory cell of the m-th row is directly connected to the source line SL. The memory cells 170 of the second row to the (m−1)-th row are electrically connected to the bit lines BL and the source lines SL through other memory cells 170 of the same columns.

The semiconductor device illustrated in FIG. 8 includes m (m is an integer of 2 or more) write word lines WWL, m read word lines RWL, the source line SL, the bit line BL, a signal line S, and m memory cells 170 (memory cells of m rows) which are arranged in the vertical direction. In the example of FIG. 8, one source line SL and one bit line BL are illustrated, but there is no particular limitations on the number and a plurality of source lines SL and a plurality of bit lines BL may be provided. For example, the configuration may include m write word lines WWL, m read word lines RWL, the source line SL, n (n is an integer of 2 or more) bit lines BL, n signal lines S, a memory cell array having the memory cells 170 arranged in a matrix of m (rows) (in the vertical direction)×n (columns) (in the horizontal direction).

In each memory cell 170, the gate electrode of the transistor 160, one of the source and drain electrodes of the transistor 162 and one electrode of the capacitor 164 are electrically connected. In addition, the signal line S is electrically connected to the other of the source and drain electrodes of the transistor 162, and the write world line WWL is electrically connected to the gate electrode of the transistor 162. Further, the read word line RWL is electrically connected to the other electrode of the capacitor 164.

Further, the source electrode of the transistor 160 included in the memory cell 170 is electrically connected to the drain electrode of the transistor 160 in the adjacent memory cell 170. The drain electrode of the transistor 160 included in the memory cell 170 is electrically connected to the source electrode of the transistor 160 in the adjacent memory cell 170. Further, the source electrode of the transistor 162 in the memory cell 170 is electrically connected to a drain electrode of the transistor 162 in one adjacent memory cell 170. The drain electrode of the transistor 162 included in the memory cell 170 is electrically connected to a source electrode of the transistor 162 in another adjacent memory cell 170.

Note that in the example of the semiconductor device illustrated in FIG. 8, the signal line S and the bit line BL are separate wirings; however, the disclosed invention is not limited to this example. The signal line S and the bit line BL may be a single wiring.

In the semiconductor device illustrated in FIG. 8, writing operation and reading operation are performed row by row. The writing operation is performed as follows.

The writing operation row by row is sequentially performed from the m-th row. In the writing operation of the k-th row (k is an integer of from 1 to m), an electric potential to turn the transistor 162_k on is applied to a write word line WWL_k of the k-th row in which data is to be written (writing operation), so that the transistor 162_k of the row for the writing operation is turned on. Here, when the transistors 162_1 to 162_(k−1) are present between the transistor 162_k and the signal line S, the transistors 162_1 to 162_(k−1) of the rows preceding the row for the writing operation are turned on, and the memory cell 170 of the k-th row for the writing operation is set to be given the electric potential of the signal line S. Accordingly, the electric potential of the signal line S is supplied to the gate electrode of the transistor 160_k of a designated row, and a predetermined charge is given to the gate electrode. Then, when the electric potential of the write word line WWL_k is fixed to GND, the electric charge given to the gate electrode of the transistor 160_k is fixed. In this manner, data can be written in the memory cell in the designated row (k-th row). In the same manner, data can be written in the memory cells of the rows preceding the (k−1)th row.

Note that in the semiconductor device illustrated in FIG. 8, the transistors 162 included in the memory cells 170 are connected in series, so that it is difficult to rewrite only data in an arbitrary row. As a rewriting method of data in the semiconductor device illustrated in FIG. 8, data may be sequentially written from the memory cell of the farthest row (m-th row) from the bit line BL. Additionally, when data "0" is written in the memory cell of the farthest row (m-th row) from the bit line BL, data "0" is also written in the memory cells of the first row to the (m−1)th row. In this manner, data of a block consisting of the memory cells of the first row to the m-th row can be erased collectively (batch erasing).

Further, the reading operation is performed as follows. First, an electric potential is given to a selection line G_1 so that the selection transistor is turned on. In addition, an electric potential at which the transistors 160 of the rows other than the row for the reading operation (e.g., the k-th row) are to be turned on is supplied to the read word lines RWL of the rows other than the row for the reading operation, regardless of the electric charge given to the gate electrode of the transistor 160_k, so that the transistors 160 of the rows other than the row for the reading operation are turned on. Then, an electric potential (reading potential) at which an on state or an off state of the transistor 160_k is determined depending on charge in the gate electrode of the transistor 160_k is supplied to the read word line RWL_k of the row for the reading operation. In addition, a fixed electric potential is applied to the source line SL and a reading circuit (not illustrated) connected to the bit line BL is operated. Here, the plurality of transistors 160_1 to 160_m between the source line SL and the bit line BL are on, except the transistor 160_k of the row for the reading operation; therefore, the conductance between the source line SL and the bit line BL is determined by a state (an on state or an off state) of the transistor 160_k of the row for the reading operation. The state (on state or off state) of the transistor 160_k of the row for the reading operation depends on which data the electric charge of the gate electrode thereof corresponds to. Thus, an electric potential of the bit line BL varies accordingly. By reading the electric potential of the bit line BL with the reading circuit, data can be read from the memory cell of the designated row.

Next, an example of a reading circuit which can be used for devices such as the semiconductor device illustrated in FIG. 8 will be described with reference to FIGS. 9A to 9C.

Figure 9A:
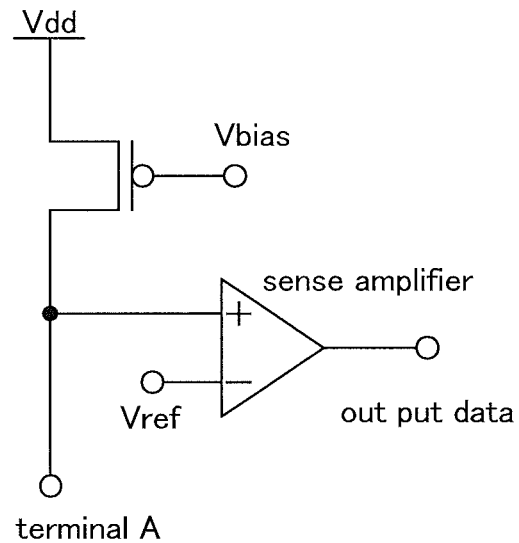
FIGS. 9A to 9C are each a circuit diagram of a semiconductor device.

FIG. 9A illustrates an outline of the reading circuit. The reading circuit includes a transistor and a sense amplifier circuit.

At the time of reading data, a terminal A is connected to a bit line BL to which a memory cell for reading operation is connected. Further, a bias potential Vbias is applied to a gate electrode of the transistor so that current supplied to the transistor is controlled.

A load connected to the terminal A of the reading circuit depends on the conductance between the source line SL and the bit line BL. Here, the conductance between the source line SL and the bit line BL is determined by a state (an on state or an off state) of a transistor in a memory cell for reading operation. In other words, the conductance between the source line SL and the bit line BL varies depending on which data the electric charge of the gate electrode of the transistor in the memory cell for reading operation corresponds to.

When the transistor in the memory cell for reading operation is turned on, the conductance between the source line SL and the bit line BL becomes high, and the electric charge of the terminal A becomes lower than the reference potential Vref. As a result, the sense amplifier circuit outputs a Low signal. On the other hand, when the transistor in the memory cell for reading operation is turned off, the conductance between the source line SL and the bit line BL becomes low, and the electric potential of the terminal A becomes higher than the reference potential Vref. As a result, the sense amplifier circuit outputs a High signal.

Thus, by using the reading circuit, data can be read from the memory cell. Note that the reading circuit of this embodiment is one of examples. For example, instead of the reference potential Vref, a reference bit line BL may be connected. In addition, if the bit line BL is charged in advance (precharged), the electric charge of the terminal A may be read, which depends on whether or not the precharged electric charge is discharged. Whether or not the precharged electric charge is discharged depends on the conductance between the source line SL and the bit line BL. In this case, a current source such as the transistor illustrated in FIG. 9A is not necessarily provided. Further, a precharge circuit may be provided.

Figure 9B:
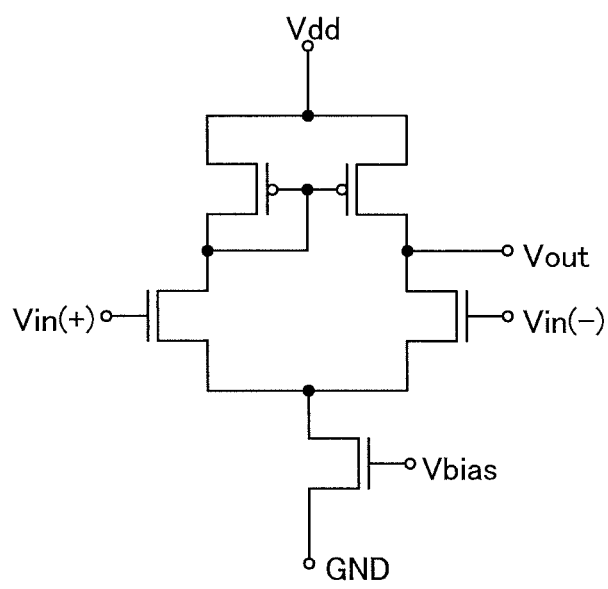

FIG. 9B illustrates a differential sense amplifier as an example of sense amplifier circuits. The differential sense amplifier has an input terminals Vin (+), Vin (−) and an output terminal Vout and amplifies the electric potential difference between Vin (+) and Vin (−). If the electric potential of Vin (+) is higher than the electric potential of Vin (−), Vout outputs a signal High, whereas if the electric potential of Vin (+) is lower than the electric potential of Vin (−), Vout outputs a signal Low. In a case where the differential sense amplifier is used for the reading circuit, one of Vin(+) and Vin(−) is connected to the terminal A, and the reference potential Vref is supplied to the other of Vin(+) and Vin(−).

Figure 9C:
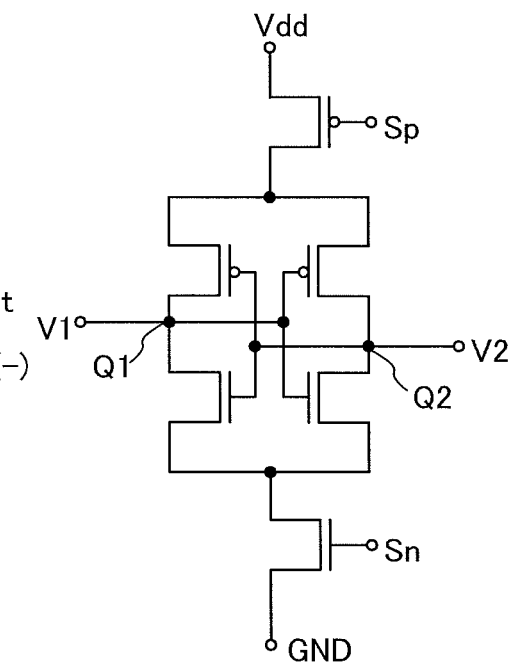

FIG. 9C illustrates a latch sense amplifier which is an example of sense amplifier circuits. The latch sense amplifier has input/output terminals V1 and V2 and input terminals for control signals Sp and Sn. First, the power supply stops when the signal Sp is set High and the signal Sn is set Low. Then, electric potentials for comparison are supplied to the input/output terminals V1 and V2. After that, the node Q1 and the node Q2 are made to be floating. Power is supplied when the signal Sp is Low and the signal Sn is High. As a result, if the electric potential of V1 is higher than that of V2, the node Q1 turns to High and the node Q2 turns Low. If the electric potential of V1 is lower than that of V2, the node Q1 turns to Low and the node Q2 turns High. And when the conductive condition between the output terminal and the node Q1 or the node Q2 is made, a signal is output. In a case where the latch sense amplifier is used as the reading circuit, for example, the node Q1 and the terminal A are connected via a switch, and the node Q2 and the reference potential Vref are connected via a switch. And the node Q1 and the output terminal may be connected via a switch.

<Cross-Sectional Structure and Planar Structure of Semiconductor Device>

Next, a specific structure of a semiconductor device to which the circuit configuration illustrated in FIG. 8 is applied will be described with drawings. FIGS. 1A and 1B illustrate an example of a structure of the semiconductor device. FIG. 1A illustrates a cross section of the semiconductor device, and FIG. 1B illustrates a plan view of the semiconductor device. Here, FIG. 1A corresponds to a cross section along the lines A1-A2, B1-B2 and C1-C2 in FIG. 1B.

In the semiconductor device illustrated in FIGS. 1A and 1B, the transistor 160 including a first semiconductor material is included in its lower portion, and a transistor 162 including a second semiconductor material is included in its upper portion. In this case, the first semiconductor material is preferably different from the second semiconductor material. For example, the first semiconductor material may be a semiconductor material (e.g., silicon) other than an oxide semiconductor and the second semiconductor material may be an oxide semiconductor. A transistor including a material other than an oxide semiconductor can operate at high speed easily. On the other hand, a transistor including an oxide semiconductor can hold charge for a long time owing to its characteristics.

Although all the transistors are n-channel transistors, it is needless to say that p-channel transistors can be used. The technical feature of one embodiment of the disclosed invention lies in the use of a semiconductor material with which off-state current can be sufficiently reduced, such as an oxide semiconductor, in the transistor 162 in order to hold data. Therefore, it is not necessary to limit specific conditions, such as a material, a structure, or the like of the semiconductor device, to those given here.

The semiconductor device described in this embodiment includes a plurality of memory cells 170 each including the transistor 160, the transistor 162 and the capacitor 164. Note that in some cases of the description below, in particular, the transistor 160 or the like used for a memory cell of the k-th (k is an integer of from 1 to m) row is referred to as a transistor 160_k or the like. FIGS. 1A and 1B illustrate the semiconductor device including the memory cells 170 of the m (m is an integer of 2 or more) rows, and a plan view and a cross-sectional view, respectively, of the transistor 160_m, the transistor 162_m and the capacitor 164_m included in the memory cell 170 of the last row, and the transistor 160_i, the transistor 162_i and the capacitor 164_i included in the memory cell 170 of the i-th (i is an integer of from 1 to (m−1)) row.

The transistor 160 illustrated in FIGS. 1A and 1B includes a channel formation region 116 provided in a substrate 100 including a semiconductor material (e.g., silicon), impurity regions 120 with the channel formation region 116 provided therebetween, metal compound regions 124 in contact with the impurity regions 120, a gate insulating layer 108 provided over the channel formation region 116, and a gate electrode 110 provided over the gate insulating layer 108. Note that a transistor whose source electrode and drain electrode are not explicitly illustrated in a drawing can be referred to as a transistor for the sake of convenience. Further, in such a case, in description of a connection of a transistor, a source region and a source electrode are collectively referred to as a "source electrode", and a drain region and a drain electrode are collectively referred to as a "drain electrode". That is, in this specification, the term "source electrode" can include a source region.

Further, an element isolation insulating layer 106 is formed over the substrate 100 so as to surround the transistor 160, and an insulating layer 128 is formed to cover the transistor 160. Note that in order to obtain high integration, the transistor 160 preferably does not have a sidewall insulating layer as illustrated in FIGS. 1A and 1B. On the other hand, when the characteristics of the transistor 160 have priority, the sidewall insulating layer may be formed on a side surface of the gate electrode 110 and the impurity region 120 may include regions with different impurity concentrations.

The transistor 162 in FIGS. 1A and 1B includes a source electrode (or a drain electrode) 142a and a drain electrode (or a source electrode) 142b over the insulating layer 128, an oxide semiconductor layer 144 electrically connected to the source electrode 142a and the drain electrode 142b, a gate insulating layer 146 covering the source electrode 142a, the drain electrode 142b, and the oxide semiconductor layer 144, and a gate electrode 148a which is over the gate insulating layer 146 to overlap the oxide semiconductor layer 144.

Here, the oxide semiconductor layer 144 is preferably a highly-purified oxide semiconductor layer made by sufficiently removing impurities such as hydrogen therefrom or sufficiently supplying oxygen thereinto. Specifically, the hydrogen concentration of the oxide semiconductor layer 144 is $5\times10^{19}$ atoms/cm$^3$ or lower, preferably $5\times10^{18}$ atoms/cm$^3$ or lower, more preferably $5\times10^{17}$ atoms/cm$^3$ or lower. Note that the hydrogen concentration of the oxide semiconductor layer 144 is measured by secondary ion mass spectrometry (SIMS). In the oxide semiconductor layer 144 which is highly purified by sufficiently reducing the concentration of hydrogen therein and in which defect levels in an energy gap due to oxygen deficiency are reduced by supplying a sufficient amount of oxygen, the carrier concentration is lower than $1\times10^{12}$/cm$^3$, preferably lower than $1\times10^{11}$/cm$^3$, more preferably lower than $1.45\times10^{10}$/cm$^3$. In this case, for example, the off-state current (per unit channel width (1 μm) here) at room temperature (25° C.) is 100 zA (1 zA (zeptoampere) is $1\times10^{-21}$ A) or less, preferably 10 zA or less. In this manner, with the use of an oxide semiconductor which is made to be an i-type (intrinsic) oxide semiconductor or a substantially i-type oxide semiconductor, the transistor 162 which has extremely favorable off-state current characteristics can be provided.

Although the oxide semiconductor layer 144 which is processed to have an island shape is used in order to suppress leakage current generated between elements due to miniaturization in the transistor 162 of FIGS. 1A and 1B, a structure including the oxide semiconductor layer 144 which is not processed to have an island shape may be employed. If the oxide semiconductor layer is not processed to have an island shape, contamination of the oxide semiconductor layer 144 due to etching in the processing can be prevented.

The capacitor 164 in FIGS. 1A and 1B includes the source electrode 142a, the gate insulating layer 146, and an electrode 148b. In other words, the source electrode 142a functions as one electrode of the capacitor 164, and the electrode 148b functions as the other electrode of the capacitor 164.

Additionally, as the capacitor 164 illustrated in FIGS. 1A and 1B, it is also possible to adopt a capacitor 164 having a stacked structure of an oxide semiconductor layer 144 and a gate insulating layer 146. Further alternatively, the capacitor 164 may be omitted if a capacitor is not needed.

Note that in the transistor 162 and the capacitor 164, the source electrode 142a and the drain electrode 142b preferably have tapered end portions. When the end portions of the source electrode 142a and the drain electrode 142b are tapered, the coverage with the gate insulating layer 146 can be improved and a breaking thereof can be prevented. At this time, the taper angle is, for example, from 30° to 60°. Note that the "taper angle" means an angle formed by the side and the bottom of a layer having a tapered shape (for example, the source electrode 142a) when observed in a direction perpendicular to a cross section thereof (a plane perpendicular to the substrate surface).

In this embodiment, the transistor 162 and the capacitor 164 are provided so as to overlap with the transistor 160. By employing such a planar layout, high integration is possible.

An insulating layer 151 is provided over the transistor 162 and the capacitor 164, and an insulating layer 152 is provided over the insulating layer 151. A wiring 156 (bit line BL) is formed over the insulating layer 152.

In the semiconductor device illustrated in FIGS. 1A and 1B, the transistors 160 in the first to the m-th rows are connected in series, sharing the impurity regions 120 and the metal compound regions 124 functioning as source regions and drain regions. The transistors 162 in the first to the m-th rows are connected in series, sharing the source electrodes or the drain electrodes. That is, the impurity region 120 and the metal compound region 124 functioning as a source region of the transistor 160 in the i-th row (i is an integer of from 1 to (m−1)) function as a drain region of the transistor 160 in the (i+1)-th row. In addition, the source electrode 142a of the transistor 162 of the i-th row functions as the drain electrode 142b of the transistor 162 of the (i+1)-th row adjacent to the i-th row. In this manner, by using the transistors 160 or the transistors 162 connected in series included in the memory cells, the occupied area of each memory cell can be reduced.

In the semiconductor device illustrated in FIGS. 1A and 1B, the source electrode 142a included in each memory cell 170 of the first row to the m-th row is provided over and in contact with the gate electrode 110. The source electrode 142a of the transistor 162_i of the i-th row includes a first region 200a in contact with the gate electrode 110 of the transistor 160_i; a second region 200b extending from the gate electrode 110 toward the oxide semiconductor layer 144 included in the transistor 162_i; and a third region 200c extending from the gate electrode 110 to the side opposite to the second region 200b (toward the oxide semiconductor layer 144 included in the transistor 162_(i+1)). Similarly, in the memory cell of the m-th row, the source electrode 142a of the transistor 162_m includes a first region 200a in contact with the gate electrode 110 of the transistor 160_m; a second region 200b extending from the gate electrode 110 toward the oxide semiconductor layer 144 included in the transistor 162_m; and a third region 200c extending from the gate electrode 110 to the side opposite to the second region 200b.

A part where the source electrode 142a and the gate electrode 110 are electrically connected in the memory cell 170 corresponds to a node FG in the circuit diagram illustrated in FIG. 8. In this case, the capacitance of the node FG in the memory cell of the i-th row is a sum of a parasitic capacitance between the second region 200b and the source region (or drain region) of the transistor 160_i, a parasitic capacitance between the third region 200c and the drain region (or source region) of the transistor 160_i, a parasitic capacitance between the second region 200b and the gate electrode 148a of the transistor 162_i, and a parasitic capacitance between the third region 200c and the gate electrode 148a of the transistor 162_(i+1)

As described above, the source electrode 142a of the transistor 162_i also serves as the drain electrode 142b of the transistor 162_(i+1), but the source electrode 142a of the transistor 162_m of the last row does not serve as a drain electrode of a transistor of the adjacent row. Accordingly, for the purpose of achieving a smaller layout, the third region 200c in the source electrode 142a of the m-th row can be omitted. However, as for the semiconductor device described in this embodiment, also in the transistor 162_m of the m-th row, provision of the third region 200c in the source electrode 142a can bring the parasitic capacitance of the node FG in the memory cell of the m-th row close to the parasitic capacitance of the node FG in the memory cell of another (i-th) row. Concretely, the parasitic capacitance of the node FG in the memory cell of the m-th row is a sum of a parasitic capacitance between the second region 200b and the source region (or drain region) of the transistor 160_m, a parasitic capacitance between the third region 200c and the drain region (or source region) of the transistor 160_m and a parasitic capacitance between the second region 200b and the gate electrode 148a of the transistor 162_m. Thus, variation of the electric potential of the nodes FG in the memory cells of the first to the m-th rows can be suppressed, and thereby the semiconductor device capable of a stable operation can be provided.

In order that the parasitic capacitance of the node FG in the memory cell of the m-th row is brought closer to the parasitic capacitance of the node FG in the memory cell of the i-th row, the parasitic capacitance between the third region 200c and the transistor 160_m included in the memory cell of the m-th row is preferably substantially equal to the parasitic capacitance between the third region 200c and the transistor 160_i included in the memory cell of the i-th row. For example, the length in the channel length direction of the third region 200c in the transistor 162_m is preferably equal to the length in the channel length direction of the third region 200c in the transistor 162_i. Further, the area of the third region 200c in the transistor 162_m overlapping with the source region or drain region of the transistor 162_m is more preferably equal to the area of the third region 200c in the transistor 162_i overlapping with the source region or drain region of the transistor 160_i.

FIGS. 2A and 2B illustrate another structure example of a semiconductor device. FIG. 2A illustrates a cross section of the semiconductor device, and FIG. 2B illustrates a plan view of the semiconductor device. FIG. 2A corresponds to a cross section along line D1-D2 in FIG. 2B. The semiconductor device illustrated in FIGS. 2A and 2B, like the semiconductor device illustrated in FIGS. 1A and 1B, includes the transistor 160 including a first semiconductor material in its lower portion, and the transistor 162 including a second semiconductor material in its upper portion.

In the semiconductor device illustrated in FIGS. 2A and 2B, the source electrode 142a of the transistor 162_m included in a memory cell of the m-th row includes the first region 200a in contact with the gate electrode 110, the second region 200b extending from the gate electrode 110 toward the oxide semiconductor layer 144, and a third region 200c extending from the gate electrode 110 to the side opposite to the oxide semiconductor layer 144. Further, the second region 200b partly includes a fourth region 200d overlapping with the gate electrode 148a, and the third region 200c partly includes a fifth region 200e overlapping with a wiring 138. The wiring 138 in FIGS. 2A and 2B corresponds to the source line SL illustrated in the circuit diagram of FIG. 8. Alternatively, the wiring 138 may be another signal line (not shown) different from the source line SL.

In the semiconductor device illustrated in FIGS. 2A and 2B, the parasitic capacitance of a node FG of the memory cell of the m-th row is a sum of a parasitic capacitance between the second region 200b and the source region (or drain region) of the transistor 160_m, a parasitic capacitance between the third region 200c and the drain region (or source region) of the transistor 160_m, a parasitic capacitance between the fourth region 200d and the gate electrode 148a of the transistor 162_m, and a parasitic capacitance between the fifth region 200e and the wiring 138. Accordingly, the parasitic capacitance of the node FG in the memory cell of the m-th row can be brought closer to, preferably made substantially equal to, the capacitance of the node FG in the memory cell of another row (the i-th row). Thus, variation of the nodes FG in the memory cells of the first to the m-th rows can be suppressed, and thereby the semiconductor device capable of a stable operation can be provided.

Note that the parasitic capacitance between the third region 200c and the transistor 160_m included in the memory cell of the m-th row is preferably substantially equal to the parasitic capacitance between the third region 200c and the transistor 160_i included in the memory cell of the i-th row so that the parasitic capacitance of the node FG in the memory cell of the m-th row is closer to the parasitic capacitance of the node FG in the memory cell of the i-th row. For example, the length in the channel length direction of the third region 200c in the transistor 162_m is preferably equal to the length of the channel length direction of the third region 200c in the transistor 162_i. In addition, the area of the third region 200c in the transistor 162_m overlapping with the source region or drain region of the transistor 160_m is more preferably equal to the area of the third region 200c in the transistor 162_i overlapping with the source region or drain region of the transistor 160_i.

Further, the parasitic capacitance between the fifth region 200e and the wiring 138 is preferably substantially equal to the parasitic capacitance between the gate electrode 148a of the transistor 162_(i+1) and the third region 200c included in the memory cell of the i-th row (concretely, a region which is part of the third region 200c and overlaps with the gate electrode 148a of the transistor 162_(i+1)). For example, the length in the channel length direction of the fifth region 200e in the transistor 162m is preferably equal to the length in the channel length direction of a region in which the third region 200c in the transistor 162_i overlaps with the gate electrode 148a of the transistor 162_(i+1). In addition, the area of the fifth region 200e in the transistor 162_m is more preferably equal to the area of a region where the third region 200c of the transistor 162_i overlaps with the gate electrode 148a of the transistor 162_(i+1).

Note that in the semiconductor device illustrated in FIGS. 2A and 2B, the wiring 138 is connected to the source region or drain region of the transistor 160_m. The structure of the semiconductor device illustrated in FIGS. 2A and 2B is similar to that of the semiconductor device illustrated in FIGS. 1A and 1B, except that the wiring 138 and the fifth region 200e overlapping with the wiring 138 are provided. Thus, a detailed description of the structure is omitted here.

In the semiconductor device illustrated in FIGS. 1A and 1B or FIGS. 2A and 2B, the memory cells of the first to the m-th rows preferably have similar layouts. For example, in the transistor 162_m included in the memory cell of the m-th row, the length in the channel length direction of the source electrode 142a is preferably substantially equal to the length in the channel length direction of the source electrode 142a of the transistor 162_i included in the memory cell of the i-th row.

Figure 11:
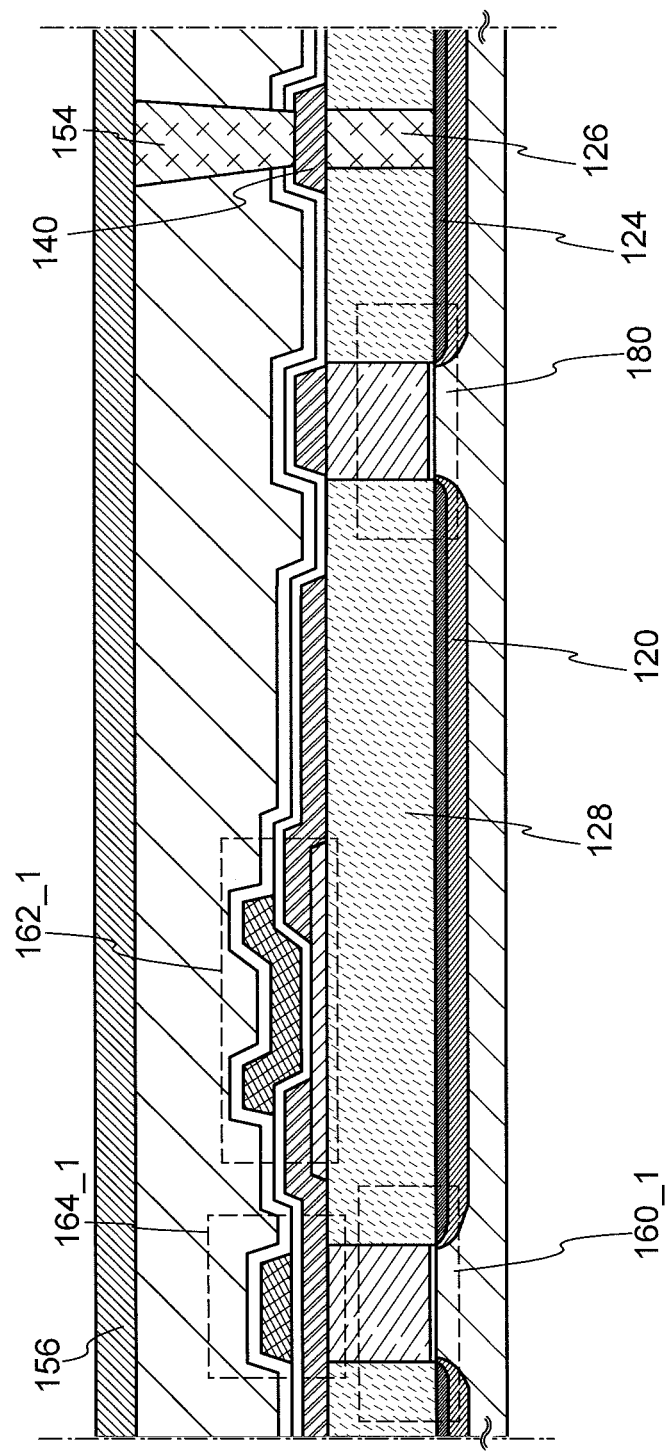
FIG. 11 is a cross-sectional view of a semiconductor device.

Further, FIG. 11 is an example of a cross sectional view of the memory cell 170 of the first row. In this embodiment, the transistor 160_1 of the first row is electrically connected to the wiring 156 via the selection transistor 180. Therefore, the impurity region 120 and the metal compound region 124 serving as a drain region of the transistor 160_1 of the first row also serve as the source region of the selection transistor 180. In this case, the selection transistor 180 can have the same structure as the transistor 160. That is, the selection transistor 180 includes a channel formation region 116 provided in the substrate 100 including a semiconductor material (e.g., silicon), the impurity regions 120 provided so as to interpose the channel formation region 116 therebetween, the metal compound regions 124 in contact with the impurity regions 120, the gate insulating layer 108 provided over the channel formation region 116, and the gate electrode 110 provided over the gate insulating layer 108.

Note that the gate electrode 110 of the selection transistor 180 functions as the selection line G in the circuit diagram of FIG. 8. The wiring 156 and the metal compound region 124 functioning as a drain region of the selection transistor 180 are electrically connected to each other via an electrode 154 provided in an opening formed in the gate insulating layer 146, an insulating layer 150, an insulating layer 151, and the like; an electrode 140 provided in the same layer as the source electrode 142a; and an electrode 126 embedded in the insulating layer 128. Here, the wiring 156 functions as the bit line BL in the circuit diagram of FIG. 8.

Figure 12:
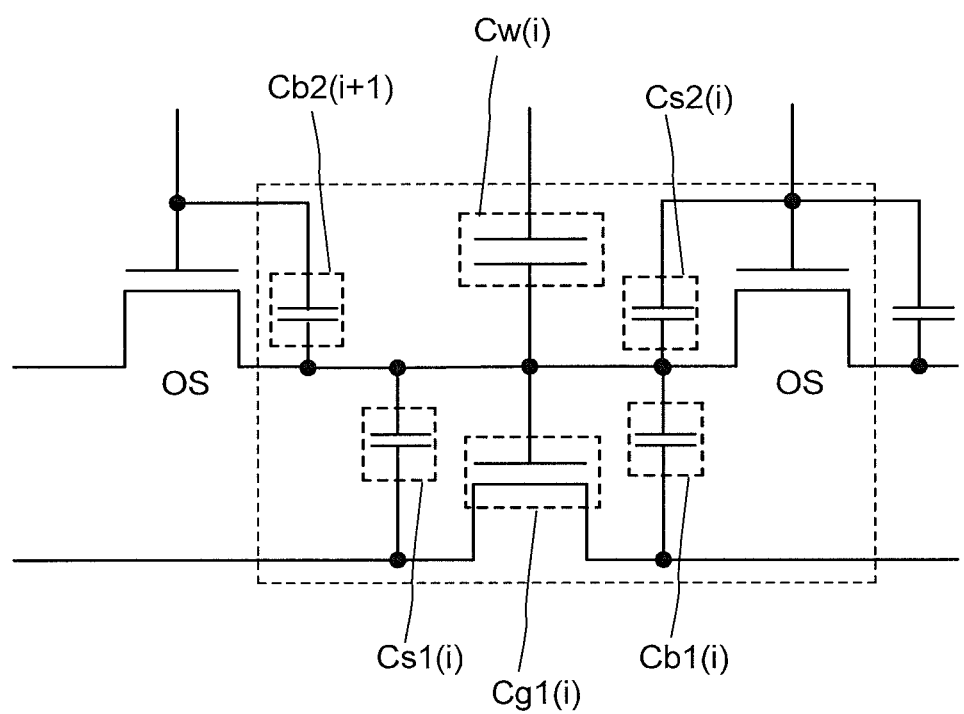
FIG. 12 is a circuit diagram of a semiconductor device.

FIG. 12 illustrates a circuit model where parasitic capacitances are added to the memory cell of the i-th (i is an integer of from 1 to (m−1)) row and a part of the memory cell of the (i+1)-th row, which are some of the memory cells illustrated in FIG. 8.

In FIG. 12, Cw(i) represents a capacitance of the capacitor; Cg1(i), a gate capacitance of the transistor 160; Cs1(i), a parasitic capacitance between the node FG and the source region or drain region (the source line SL side in the circuit diagram) of the transistor 160_i; Cb1(i), a parasitic capacitance between the node FG and the source region or drain region (the bit line BL side in the circuit diagram) of the transistor 160_i; Cs2(i), a parasitic capacitance between the node FG and the gate electrode of the transistor 162_i; and Cb2(i+1), a parasitic capacitance between the node FG and the gate electrode of the transistor 162_i of the memory cell adjacent to the source line side.

The capacitance (Cfg) connected to the node FG is represented by Cfg(i)=Cw(i)+Cg1(i)+Cpara(i). Note that Cpara represents a parasitic capacitance, which is represented by Cpara(i)=Cb1(i)+Cb1(i)+Cs2(i)+Cb2(i+1) on the basis of the above-described model.

In a case where the parasitic capacitance (Cpara) is sufficiently small, and the relation of Cw+Cgate1>>Cpara is satisfied, variation of Cpara has no influences on operation characteristics of the semiconductor device. However, for example, if a process for miniaturization is adopted and the capacitance (Cfg) connected to the node FG becomes smaller, the parasitic capacitance (Cpara) becomes larger, relatively. As a result, variation of the parasitic capacitance (Cpara) matters, which possibly leads to adverse influence on the operation characteristics.

In addition, for example, in a case where the number of states the memory cell can store is a multivalue of three or more, the potential difference of the node FG to be used to differentiate the states becomes small, and thus the electric potential of the node FG in each memory cell is required to be controlled with accuracy. In this case, the variation of the parasitic capacitance (Cpara) possibly leads to adverse influences on the operation characteristics.

Although depending on a driving method of the semiconductor device, variation of the electric potential of the node FG in the memory cell at the time of reading operation is caused by variation of the parasitic capacitances (Cpara). For example, in a selected memory cell, 0 V is applied to the read word line at the time of writing operation, and VR (e.g., −2 V) is applied to the read word line at the time of reading operation. In this case, when the electric potential of the node FG at the time of writing operation is VFG0, the electric potential of the node FG at the time of reading operation is represented by VFG1=VFG0+VRL×Cw/Cfg. Here, since the capacitance (Cfg) connected to the node FG includes the parasitic capacitance (Cpara), it is known that the variation of the parasitic capacitance (Cpara) causes variation of the electric potential (VFG1) of the node FG of the memory cell which conducts reading at the time of reading operation.

As illustrated in FIGS. 1A and 1B, the memory cells of the first to the (m−1)th row can have the same structure and layout, the capacitances connected to the nodes FG are substantially equal. On the other hand, the memory cell of the m-th row cannot have the same structure and layout as the memory cells of the first to the (m−1)th row, since there is no memory cell of the (m+1)th row. For example, the capacitance connected to the node FG in the memory cell of the m-th row does not include a component of Cb2(m+1). Therefore, the parasitic capacitance (Cpara(m)) of the memory cell of the m-th row is smaller than the parasitic capacitance (Cpara(i)) of the memory cell of another row. Additionally, if the third region 200c is not provided in the memory cell of the m-th row, Cs1(m) is smaller than Cs1(i), and thus the difference between the parasitic capacitance (Cpara(m)) of the memory cell of the m-th row and the parasitic capacitance (Cpara(i)) of the memory cell of another row becomes much larger.

This means that even when each memory cell stores the same data, the electric potential of the node FG at the time of reading operation of the memory cell of the i-th row is different from the electric potential of the node FG at the time of reading of the memory cell of the m-th row. As a result, stability of the reading operation in the semiconductor device is decreased.

On the other hand, in the semiconductor device described in this embodiment, the third region 200c is intentionally provided in the transistor 162_m, although the memory cell of the m-th row can be further miniaturized in terms of the process accuracy. Thus, the parasitic capacitance Cs1(m) of the memory cell of the m-th row can be close to the parasitic capacitance Cs1(i) of another memory cell. In this case, "intentionally provided" aims to a design larger than the minimum limit on the process accuracy.

In one embodiment of the present invention, the parasitic capacitance Cs1(m) between the third region 200c and the source region or drain region of the transistor 160 of the memory cell of the m-th row is not necessarily equal to the parasitic capacitance Cs1(i) of the memory cell of another row. By employing the parasitic capacitances close to each other, variation on the parasitic capacitances between the memory cells can be suppressed. In other words, it is effective to suppress the variation enough to obtain normal operation characteristics of the semiconductor device. For example, an example in which a third region 200c(m) is provided such that the parasitic capacitance Cs1(m) of the memory cell of the m-th row is half of or more than half of the parasitic capacitance Cs1(i) of the memory cell of another row can be regarded as the example in which the third region 200c is intentionally provided, and is preferable because variation of the parasitic capacitance between the memory cells can be reduced.

More preferably, the third region 200c is provided so that the parasitic capacitance Cs1(m) of the memory cell of the m-th row is substantially equal to the parasitic capacitance Cs1(i) of the memory cell of another row. For example, the layout pattern of the third region 200c of the memory cell of the m-th row is preferably the same as that of the third region 200c of the memory cell of another row. Alternatively, the area of the third region 200c overlapping with the source region or drain region of the transistor 160 in the memory cell of the m-th row is preferably equal to the area of the third region 200c overlapping with the source region or drain region of the transistor 160 in the memory cell of another row. Actually, variation exists in the process (in the manufacturing process of transistors), and thus the overlapping areas (patterns) are not completely equal. Thus, the overlapping areas (patterns) are equal within the acceptable range of the variation in the process. Accordingly, "the parasitic capacitances are equal" means that the parasitic capacitances are equal within the acceptable range of the variation in the process. So it means that the shapes of the third region 200c(m) and the third region 200c(i) are preferably the same within the acceptable range of the variation in the process. Alternatively, the area of the third region 200c(m) overlapping with the source region or drain region of the transistor 160_m is preferably equal to the area of the third region 200c(i) overlapping with the source region or drain region of the transistor 160_i within the acceptable range of the variation in the process.

Further, in the semiconductor device illustrated in FIGS. 2A and 2B, because the fifth region 200e is provided in the memory cell of the m-th row, the parasitic capacitance is generated between the wiring 138 and the fifth region 200e. This means that the parasitic capacitance substantially equal to the parasitic capacitance (Cb2(i+1)) between the node FG and the gate electrode of the transistor 162 of the adjacent memory cell on the source line side, which is not present in the memory cell of the m-th row, is obtained. As a result, the parasitic capacitance (Cpara(m)) of the memory cell of the m-th row can be close to the parasitic capacitance (Cpara(i)) of the memory cell of another row.

Note that the fifth region 200e is preferably provided in the memory cell of the m-th row so that the parasitic capacitance generated by the fifth region 200e is substantially equal to the parasitic capacitance (Cb2(i+1) between the node FG in the memory cell of the i-th row and the gate electrode of the transistor 162_(i+1) of the adjacent memory cell on the source line side. For example, when the node FG of the memory cell of the i-th row overlaps with the gate electrode of the transistor 162_(i+1), the node FG of the memory cell of the m-th row preferably overlaps with the wiring 138, and the overlapping areas are preferably the same. In addition, even when the node FG of the memory cell of the i-th row and the gate electrode of the transistor 162_(i+1) do not overlap with each other (a so-called offset structure), it is effective to provide the wiring 138. In this case, it is preferable that the node FG of the memory cell of the m-th row does not overlap with the wiring 138, and more preferable that the length in the channel length direction from the source electrode 142a in the transistor 162_m to the wiring 138 is substantially equal to the offset width.

<Method for Manufacturing Semiconductor Device>

Next, an example of a method for manufacturing the semiconductor device will be described. First, a method for manufacturing the transistor 160 in the lower portion will be described below with reference to FIGS. 3A to 3D and FIGS. 4A to 4D; then, a method for manufacturing the transistor 162 in the upper portion and the capacitor 164 will be described with reference to FIGS. 5A to 5C and FIGS. 6A and 6B.

<Method for Manufacturing Transistor in Lower Portion>

First, the substrate 100 including a semiconductor material is prepared (see FIG. 3A). A single crystal semiconductor substrate or a polycrystalline semiconductor substrate of silicon, silicon carbide, or the like, a compound semiconductor substrate of silicon germanium or the like, an SOI substrate, or the like can be used as the substrate 100 including a semiconductor material. Here, an example of the case where a single crystal silicon substrate is used as the substrate 100 including a semiconductor material is described. Note that the term "SOI substrate" generally means a substrate where a silicon semiconductor layer is provided over an insulating surface. In this specification and the like, the term "SOI substrate" also means a substrate where a semiconductor layer including a material other than silicon is provided over an insulating surface. That is, a semiconductor layer included in the "SOI substrate" is not limited to a silicon semiconductor layer. Moreover, the category of "SOI substrate" includes a substrate having a structure where a semiconductor layer is provided over an insulating substrate such as a glass substrate with an insulating layer interposed therebetween.

It is preferable that a single crystal semiconductor substrate of especially silicon or the like is used as the substrate 100 including a semiconductor material because the speed of reading operation of the semiconductor device can be increased.

A protective layer 102 serving as a mask for forming an element isolation insulating layer is formed over the substrate 100 (see FIG. 3A). As the protective layer 102, an insulating layer formed using a material such as silicon oxide, silicon nitride or silicon oxynitride can be used, for example. Note that before or after this step, an impurity element imparting n-type conductivity or an impurity element imparting p-type conductivity may be added to the substrate 100 in order to control the threshold voltage of the transistor. When the semiconductor material is silicon, phosphorus, arsenic, or the like can be used as the impurity imparting n-type conductivity. Boron, aluminum, gallium, or the like can be used as the impurity imparting p-type conductivity.

Next, part of the substrate 100 in a region not covered with the protective layer 102 (i.e., in an exposed region) is removed by etching with use of the protective layer 102 as a mask. Thus, a semiconductor region 104 isolated from other semiconductor regions is formed (see FIG. 3B). As the etching, dry etching is preferably performed, but wet etching may be performed. An etching gas or an etchant can be selected as appropriate depending on a material to be etched.

Figure 3C:
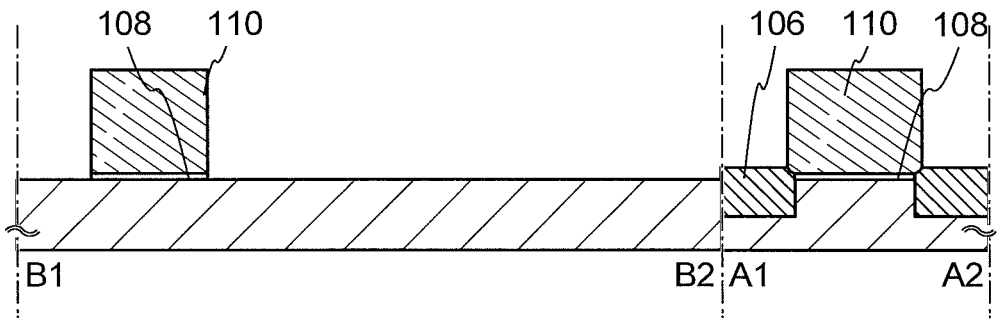

Then, an insulating layer is formed over the substrate 100, and the insulating layer in a region overlapping with the semiconductor region 104 is selectively removed; thus, the element isolation insulating layer 106 is formed (see FIG. 3C). The insulating layer is formed using silicon oxide, silicon nitride, silicon oxynitride, or the like. As a method for removing the insulating layer, any of etching treatment, polishing treatment such as chemical mechanical polishing (CMP), and the like can be employed. Note that the protective layer 102 is removed after the formation of the semiconductor region 104 or after the formation of the element isolation insulating layer 106.

Next, an insulating layer is formed over a surface of the semiconductor region 104, and a layer including a conductive material is formed over the insulating layer.

The insulating layer is processed into a gate insulating layer later and can be formed by, for example, heat treatment (thermal oxidation treatment, thermal nitridation treatment, or the like) to the surface of the semiconductor region 104. Instead of the heat treatment, high-density plasma treatment may be employed. The high-density plasma treatment can be performed using, for example, a mixed gas of any of a rare gas such as He, Ar, Kr, or Xe, oxygen, nitrogen oxide, ammonia, nitrogen, hydrogen, and the like. Needless to say, the insulating layer may be formed by a CVD method, a sputtering method, or the like. The insulating layer preferably has a single-layer structure or a stacked-layer structure with a film including silicon oxide, silicon oxynitride, silicon nitride, hafnium oxide, aluminum oxide, tantalum oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0)) to which nitrogen is added, or the like. The insulating layer can have a thickness of 1 nm to 100 nm, preferably, 10 nm to 50 nm, for example.

The layer including a conductive material can be formed using a metal material such as aluminum, copper, titanium, tantalum, or tungsten. The layer including a conductive material may be formed using a semiconductor material such as polycrystalline silicon. There is no particular limitation on the method for forming the layer including a conductive material, and a variety of film formation methods such as an evaporation method, a CVD method, a sputtering method, or a spin coating method can be employed. Note that in this embodiment, an example of the layer including a conductive material which is formed using a metal material is described.

After that, the insulating layer and the layer including a conductive material are selectively etched; thus, the gate insulating layer 108 and the gate electrode 110 are formed (see FIG. 3C).

Figure 3D:
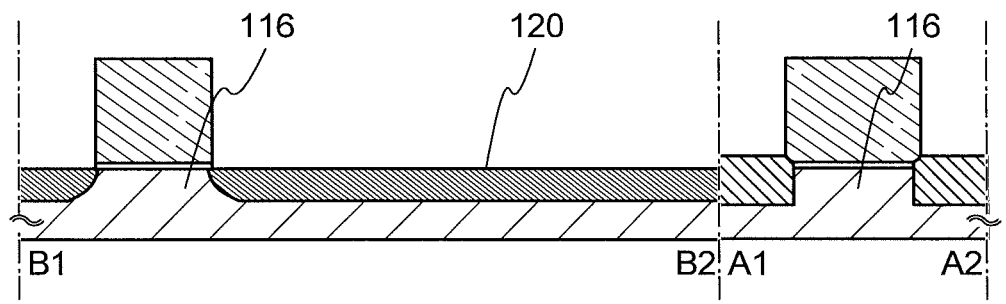

Next, phosphorus (P) or arsenic (As) is added to the semiconductor region 104, whereby the channel formation region 116 and the impurity regions 120 are formed (see FIG. 3D). Note that phosphorus or arsenic is added in order to form an n-channel transistor; an impurity element such as boron (B) or aluminum (Al) may be added in the case of forming a p-channel transistor. Here, the concentration of the impurity added can be set as appropriate; the concentration is preferably set high when a semiconductor element is highly miniaturized.

Note that a sidewall insulating layer may be formed around the gate electrode 110, and impurity regions to which the impurity element is added at a different concentration may be formed.

Figure 4A:
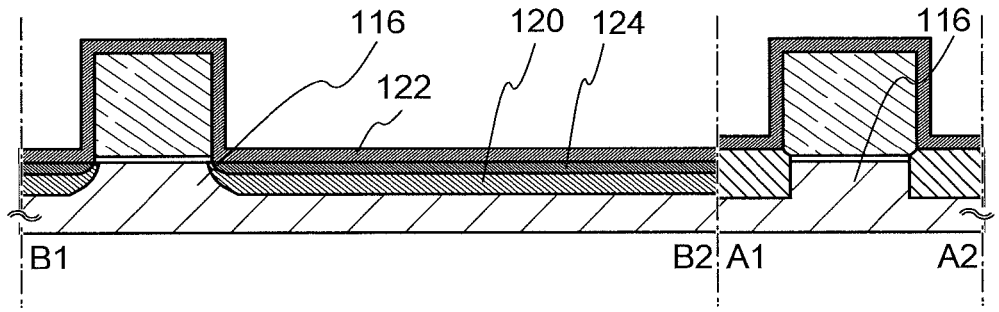
FIGS. 4A to 4D are cross-sectional views illustrating a manufacturing process of a semiconductor device.
Figure 4B:
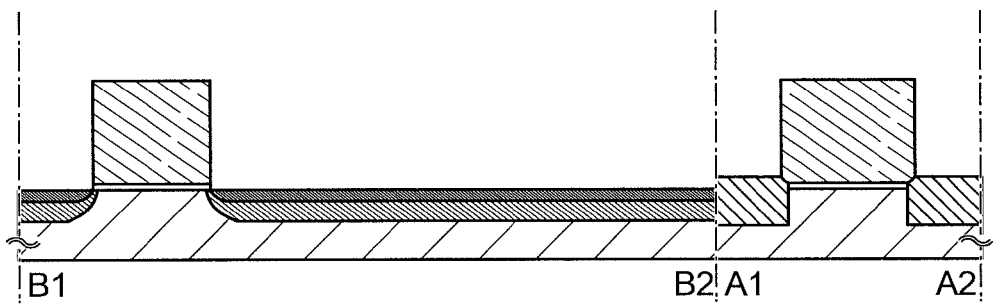

Next, a metal layer 122 is formed so as to cover the gate electrode 110, the impurity regions 120, and the like (see FIG. 4A). The metal layer 122 can be formed by any of a variety of film formation methods such as a vacuum evaporation method, a sputtering method, and a spin coating method. The metal layer 122 is preferably formed using a metal material which will turn into a low-resistance metal compound by reacting with the semiconductor material included in the semiconductor region 104. Examples of such metal materials include titanium, tantalum, tungsten, nickel, cobalt, platinum, and the like.

Next, heat treatment is performed so that the metal layer 122 reacts with the semiconductor material. Thus, the metal compound regions 124 that are in contact with the impurity regions 120 are formed (see FIG. 4A). Note that when the gate electrode 110 is formed using polycrystalline silicon or the like, a metal compound region is also formed in a portion of the gate electrode 110 which is in contact with the metal layer 122.

As the heat treatment, irradiation with a flash lamp can be employed, for example. Although it is needless to say that another heat treatment method may be used, a method by which heat treatment can be achieved in an extremely short time is preferably adopted in order to improve the controllability of chemical reaction for formation of the metal compound. Note that the metal compound regions are formed by reaction of the metal material and the semiconductor material and have sufficiently high conductivity. The formation of the metal compound regions can properly reduce the electric resistance and improve element characteristics. Note that the metal layer 122 is removed after the metal compound regions 124 are formed (see FIG. 4B).

Figure 4C:
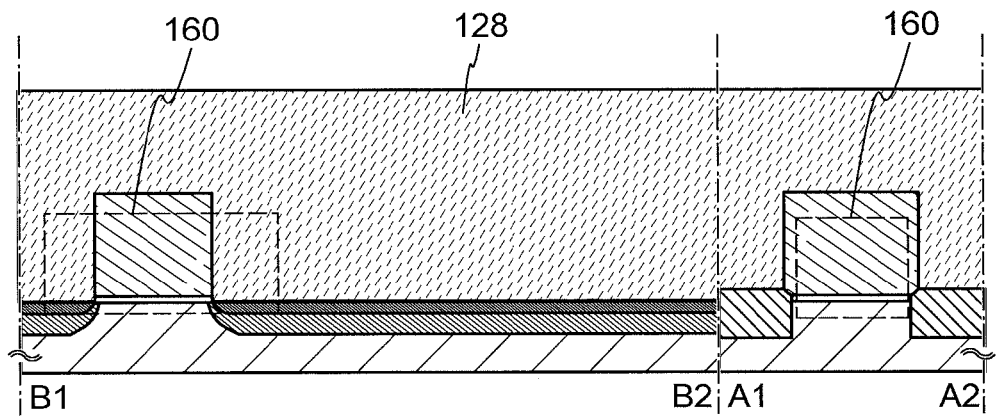

Next, the insulating layer 128 is formed so as to cover the components formed in the above steps (see FIG. 4C). The insulating layer 128 can be formed using an inorganic insulating material such as silicon oxide, silicon oxynitride, silicon nitride, or aluminum oxide. It is particularly preferable to use a low dielectric constant (low-k) material for the insulating layer 128 because capacitance due to overlap of electrodes or wirings can be sufficiently reduced. Note that a porous insulating layer with such a material may be employed as the insulating layer 128. The porous insulating layer has a lower dielectric constant than an insulating layer with high density and thus makes it possible to further reduce capacitance due to electrodes or wirings. Alternatively, the insulating layer 128 can be formed using an organic insulating material such as polyimide or acrylic. Note that although a single layer structure of the insulating layer 128 is used in this embodiment, one embodiment of the disclosed invention is not limited to this example. The insulating layer may have a stacked structure of two layers or more.

Through the above steps, the transistor 160 including the substrate 100 including a semiconductor material is formed (see FIG. 4C). One feature of the transistor 160 lies in high speed operation. With the use of that transistor as a reading transistor, data can be read at high speed.

Figure 4D:
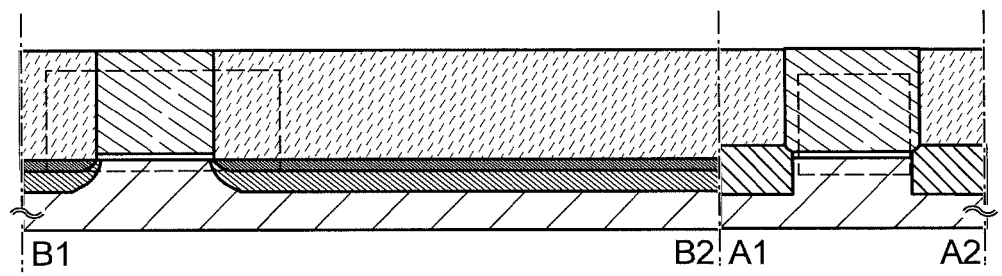

After that, as treatment performed before the transistor 162 and the capacitor 164 are formed, CMP treatment to the insulating layer 128 is performed so that an upper surface of the gate electrode 110 is exposed (see FIG. 4D). As treatment for exposing the upper surface of the gate electrode 110, etching treatment, or the like can also be employed instead of CMP treatment, but in order to improve characteristics of the transistor 162, the surface of the insulating layer 128 is preferably made as flat as possible.

Note that before or after each of the above steps, a step of forming an electrode, a wiring, a semiconductor layer, an insulating layer, or the like may be further performed. For example, when the wiring has a multi-layer structure of a stacked-layer structure including insulating layers and conductive layers, a highly integrated semiconductor device can be realized.

<Method for Manufacturing Transistor in Upper Portion>

Figure 5A:
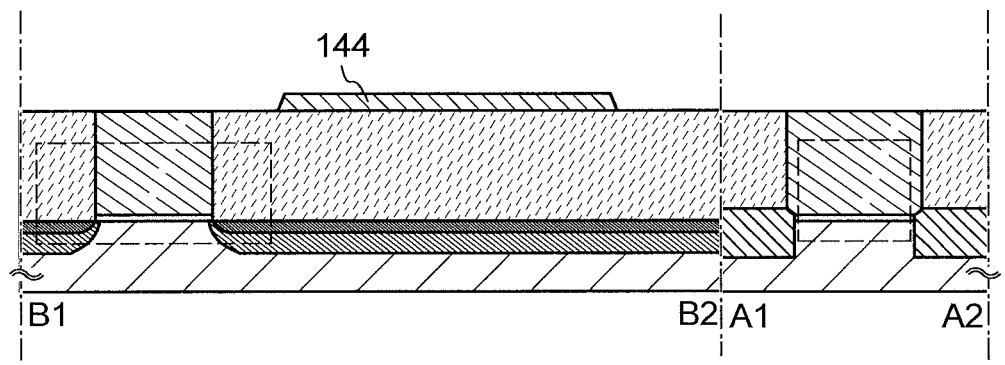
FIGS. 5A to 5C are cross-sectional views illustrating a manufacturing process of a semiconductor device.

Next, an oxide semiconductor layer is formed over the gate electrode 110, the insulating layer 128, and the like, and selectively etched to form an oxide semiconductor layer 144 (see FIG. 5A). Note that an insulating layer serving as a base may be provided over the insulating layer 128. The insulating layer can be formed by a PVD method, a CVD method, or the like.

The oxide semiconductor layer can be formed using a four-component metal oxide such as an In—Sn—Ga—Zn-based oxide semiconductor, a three-component metal oxide such as an In—Ga—Zn-based oxide semiconductor, an In—Sn—Zn-based oxide semiconductor, an In—Al—Zn-based oxide semiconductor, a Sn—Ga—Zn-based oxide semiconductor, an Al—Ga—Zn-based oxide semiconductor, or a Sn—Al—Zn-based oxide semiconductor, a two-component metal oxide such as an In—Zn-based oxide semiconductor, an In—Ga-based oxide semiconductor, a Sn—Zn-based oxide semiconductor, an Al—Zn-based oxide semiconductor, a Zn—Mg-based oxide semiconductor, a Sn—Mg-based material, or an In—Mg-based oxide semiconductor, a single-component metal oxide such as an In-based oxide semiconductor, a Sn-based oxide semiconductor, or a Zn-based oxide semiconductor, or the like.

In particular, an In—Ga—Zn-based oxide semiconductor material has sufficiently high resistance when there is no electric field and thus off-state current can be sufficiently reduced. In addition, with high field-effect mobility, the In—Ga—Zn-based oxide semiconductor material is suitable for a semiconductor device.

As a typical example of the In—Ga—Zn-based oxide semiconductor material, one represented by $InGaO_3(ZnO)_m$ (m>0) is given. Using M instead of Ga, there is an oxide semiconductor material represented by $InMO_3(ZnO)_m$ (m>0). Here, M denotes one or more metal elements selected from the group of gallium (Ga), aluminum (Al), iron (Fe), nickel (Ni), manganese (Mn), cobalt (Co), and the like. For example, M can be Ga, Ga and Al, Ga and Fe, Ga and Ni, Ga and Mn, Ga and Co, or the like. Note that the above-described compositions are derived from the crystal structures and are merely examples.

In this embodiment, the oxide semiconductor layer is formed by a sputtering method using an In—Ga—Zn-based oxide semiconductor deposition target.

When an In—Ga—Zn-based material is used for the oxide semiconductor layer, a preferable material is represented by In:Ga:Zn=1:x:y (x is 0 or more, y is from 0.5 to 5). For example, a target for oxide semiconductor deposition which has a composition ratio expressed by $In_2O_3:Ga_2O_3:ZnO=1:1:2$ [molar ratio] (x=1, y=1) or the like can be used. Alternatively, a target for oxide semiconductor deposition which has a composition ratio of $In_2O_3:Ga_2O_3:ZnO=1:1:1$ [molar ratio] (x=1, y=0.5), a target for oxide semiconductor deposition which has a composition ratio of $In_2O_3:Ga_2O_3:ZnO=1:1:4$ [molar ratio] (x=1, y=2), or a target for oxide semiconductor deposition which has a composition ratio of $In_2O_3:Ga_2O_3:ZnO=1:0:2$ [molar ratio] (x=0, y=1) can be used.

In this embodiment, an oxide semiconductor layer with an amorphous structure is formed by sputtering with the use of an In—Ga—Zn—O-based oxide semiconductor deposition target.

Further, an In—Zn-based oxide semiconductor material can be used as oxide semiconductor. In the case where an In—Zn-based oxide semiconductor material is used as an oxide semiconductor, a target to be used has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), more preferably In:Zn=15:1 to 1.5:1 in an atomic ratio ($In_2O_3$:ZnO=15:2 to 3:4 in a molar ratio). For example, as for a target used for formation of an In—Zn-based oxide semiconductor which has an atomic ratio of In:Zn:O=X:Y:Z, the relation of Z>1.5X+Y is satisfied.

It is preferable that a metal oxide semiconductor contained in the oxide semiconductor deposition target has a relative density of 80% or more, preferably 95% or more, more preferably 99.9% or more. With the use of a target for forming an oxide semiconductor with high relative density, an oxide semiconductor layer with a dense structure can be formed.

The atmosphere in which the oxide semiconductor layer is formed is preferably a rare gas (typically argon) atmosphere, an oxygen atmosphere, or a mixed atmosphere containing a rare gas (typically argon) and oxygen. Specifically, it is preferable to use a high-purity gas atmosphere, for example, from which impurities such as hydrogen, water, hydroxyl, or hydride are removed so that the concentration thereof is reduced to 1 ppm or less (preferably to 10 ppb or less).

In forming the oxide semiconductor layer, an object is held in a treatment chamber that is maintained at reduced pressure and is heated so that the temperature of the object is higher than or equal to 100° C. and lower than 550° C., preferably higher than or equal to 200° C. and lower than or equal to 400° C. Alternatively, the temperature of the object in the formation of the oxide semiconductor layer may be room temperature (25° C.±10° C.). Then, a sputtering gas from which hydrogen, water, and the like are removed is introduced into the treatment chamber while moisture in the treatment chamber is removed, whereby the oxide semiconductor layer is formed using the above target. By forming the oxide semiconductor layer while heating the object, impurities in the oxide semiconductor layer can be reduced. In addition, damage of the oxide semiconductor layer due to sputtering can be reduced. In order to remove moisture in the treatment chamber, an entrapment vacuum pump is preferably used. For example, a cryopump, an ion pump, a titanium sublimation pump, or the like can be used. A turbo pump provided with a cold trap may be used. By performing evacuation with the use of a cryopump or the like, hydrogen, water, and the like can be removed from the treatment chamber; thus, the impurity concentration in the oxide semiconductor layer can be reduced.

The oxide semiconductor layer can be formed under the following conditions, for example: the distance between the object and the target is 170 mm, the pressure is 0.4 Pa, the direct current (DC) power is 0.5 kW, and the atmosphere is an oxygen (oxygen: 100%) atmosphere, an argon (argon: 100%) atmosphere, or a mixed atmosphere including oxygen and argon. Note that a pulsed direct current (DC) power source is preferably used because powder substances (also referred to as particles or dust) generated in film formation can be reduced and thickness distribution can be small. The thickness of the oxide semiconductor layer is from 1 nm to 50 nm, preferably from 1 nm to 30 nm, more preferably from 1 nm to 10 nm. With the oxide semiconductor layer having such a thickness, a short-channel effect accompanying miniaturization can be suppressed. Note that an appropriate thickness differs depending on an oxide semiconductor material used, the usage of a semiconductor device, or the like; therefore, it is also possible to set the thickness as appropriate depending on the material to be used, the usage, or the like.

Note that before the oxide semiconductor layer is formed by a sputtering method, reverse sputtering in which plasma is generated with an argon gas is preferably performed, so that substances attached to a surface on which the oxide semiconductor layer is to be formed (e.g., a surface of the insulating layer 128) are removed. Here, the reverse sputtering refers to a method in which ions collide with a surface of the substrate to be processed in order to modify the surface, in contrast to normal sputtering which refers to a method in which ions collide with a sputtering target. An example of a method for making ions collide with a surface to be processed is a method in which high-frequency voltage is applied to the surface to be processed in an argon atmosphere so that plasma is generated near the object to be processed. Note that an atmosphere of nitrogen, helium, oxygen, or the like may be used instead of an argon atmosphere.

After that, heat treatment (first heat treatment) is preferably performed on the oxide semiconductor layer. Excessive hydrogen (including water and hydroxyl group) in the oxide semiconductor layer is removed by the first heat treatment and a structure of the oxide semiconductor layer is improved, so that a defect level in energy gap of the oxide semiconductor layer can be reduced. The temperature of the first heat treatment is, for example, higher than or equal to 300° C. and lower than 550° C., preferably from 400° C. to 500° C.

The heat treatment can be performed in such a way that, for example, an object to be heated is introduced into an electric furnace in which a resistance heating element or the like is used, under a nitrogen atmosphere at 450° C. for 1 hour. During the heat treatment, the oxide semiconductor layer is not exposed to the atmosphere to prevent the entry of water and hydrogen.

The heat treatment apparatus is not limited to the electric furnace and may be an apparatus for heating an object by thermal radiation or thermal conduction from a medium such as a heated gas. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object to be processed by heat treatment, such as nitrogen or a rare gas such as argon is used.

For example, as the first heat treatment, a GRTA process may be performed as follows. The object is put in an inert gas atmosphere that has been heated, heated for several minutes, and taken out from the inert gas atmosphere. The GRTA process enables brief high-temperature heat treatment. Moreover, the GRTA process can be employed even when the temperature exceeds the upper temperature limit of the object. Note that the inert gas may be switched to a gas including oxygen during the process. This is because defect level in energy gap due to oxygen deficiency can be reduced by performing the first heat treatment in an atmosphere including oxygen.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is 6 N (99.9999%) or more, preferably 7 N (99.99999%) or more (that is, the concentration of the impurities is 1 ppm or less, preferably 0.1 ppm or less).

In any case, impurities are reduced and oxygen is supplied by the first heat treatment so that the i-type (intrinsic) or substantially i-type oxide semiconductor layer is obtained. Accordingly, a transistor having significantly excellent characteristics can be realized.

The above heat treatment (first heat treatment) can be referred to as dehydration treatment, dehydrogenation treatment, or the like because of its effect of removing hydrogen, water, and the like. The dehydration treatment or dehydrogenation treatment can be performed, for example, after the oxide semiconductor layer is formed, after the gate insulating layer is formed, or after the gate electrode is formed. Such dehydration treatment or dehydrogenation treatment may be conducted once or plural times.

The oxide semiconductor layer may be etched either before or after the heat treatment. In view of miniaturization of elements, dry etching is preferably used; however, wet etching may be used. An etching gas and an etchant can be selected as appropriate depending on a material of the layer to be etched.

Figure 5B:
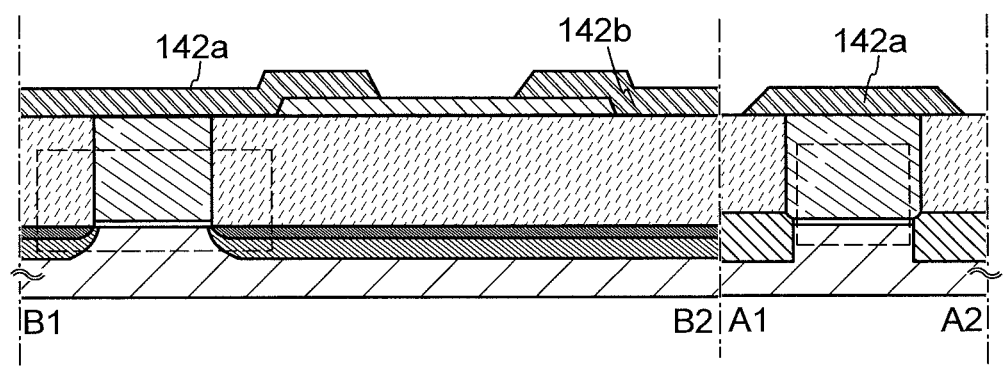
Figure 5C:
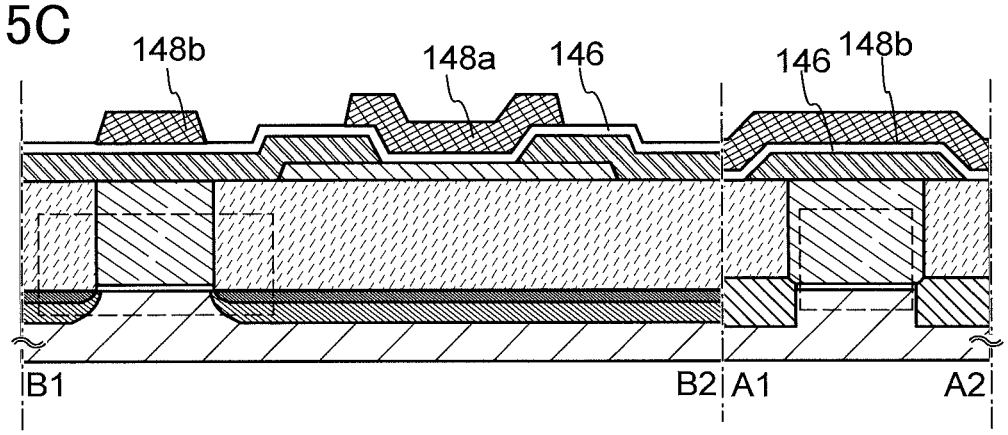

Then, a conductive layer is formed over the gate electrode 110, the insulating layer 128, the oxide semiconductor layer 144 and the like, and is selectively etched, whereby the source electrode 142*a* and the drain electrode 142*b* are formed (see FIG. 5B).

The conductive layer can be formed by a PVD method such as a sputtering method, or a CVD method such as a plasma CVD method. As a material for the conductive layer, an element selected from the group of aluminum, chromium, copper, tantalum, titanium, molybdenum, and tungsten; an alloy containing any of these elements as a component; or the like can be used. Further, one material selected from the group of manganese, magnesium, zirconium, beryllium, neodymium and scandium or a combined material of some of these elements may be used.

The conductive layer can have a single-layer structure or a stacked structure including two or more layers. For example, a single-layer structure of a titanium film or a titanium nitride film, a single-layer structure of an aluminum film including silicon, a two-layer structure in which a titanium film is stacked over an aluminum film, a two-layer structure in which a titanium film is stacked over a titanium nitride film, a three-layer structure in which a titanium film, an aluminum film, and a titanium film are stacked in this order, and the like can be given. Note that in the case where the conductive layer has the single-layer structure of a titanium film or a titanium nitride film, there is an advantage that the conductive layer can be easily processed into the source electrode 142a and the drain electrode 142b having tapered shapes.

Alternatively, the conductive layer may be formed using a conductive metal oxide. As the conductive metal oxide, indium oxide ($In_2O_3$), tin oxide ($SnO_2$), zinc oxide ($ZnO$), an indium oxide-tin oxide alloy ($In_2O_3$—$SnO_2$, which is abbreviated to ITO in some cases), an indium oxide-zinc oxide alloy ($In_2O_3$—$ZnO$), or any of these metal oxide materials in which silicon or silicon oxide is included can be used.

The conductive layer is preferably etched so that end portions of the source electrode 142a and the drain electrode 142b that are to be formed are tapered. Here, the taper angle is, for example, preferably from 30° to 60°. The etching is performed so that the end portions of the source electrode 142a and the drain electrode 142b are tapered, whereby coverage with the gate insulating layer 146 formed later can be improved and disconnection can be prevented.

The channel length (L) of the transistor in the upper portion is determined by a distance between lower end portions of the source electrode 142a and the drain electrode 142b. Note that for light exposure for forming a mask used in a case where a transistor with a channel length (L) of less than 25 nm is formed, it is preferable to use extreme ultraviolet rays whose wavelength is as short as several nanometers to several tens of nanometers. In the light exposure by extreme ultraviolet light, the resolution is high and the focus depth is large. For these reasons, the channel length (L) of the transistor to be formed later can be in the range of from 10 nm to 1000 nm (1 μm), and the circuit can operate at higher speed. Moreover, miniaturization can lead to low power consumption of a semiconductor device.

Then, the gate insulating layer 146 is formed to be in contact with part of the oxide semiconductor layer 144, the source electrode 142a and the drain electrode 142b. After that, over the gate insulating layer 146, the gate electrode 148a is formed in a region overlapping with the oxide semiconductor layer 144 and the electrode 148b is formed in a region overlapping with the gate electrode 110 and the source electrode 142a (see FIG. 5C).

The gate insulating layer 146 can be formed by a CVD method, a sputtering method, or the like. The gate insulating layer 146 is preferably formed so as to contain silicon oxide, silicon nitride, silicon oxynitride, aluminum oxide, tantalum oxide, hafnium oxide, yttrium oxide, hafnium silicate (Hf-$Si_xO_y$, (x>0, y>0)), hafnium silicate (HfSi$_x$O$_y$, (x>0, y>0)) to which nitrogen is added, hafnium aluminate (HfAl$_x$O$_y$, (x>0, y>0)) to which nitrogen is added, or the like. The gate insulating layer 146 may have a single-layer structure or a stacked structure. There is no particular limitation on the thickness; however, in the case where a semiconductor device is miniaturized, the thickness is preferably small for ensuring operation of the transistor. For example, in the case where silicon oxide is used, the thickness can be set within the range of from 1 nm to 100 nm, preferably from 10 nm to 50 nm.

When the gate insulating layer is thin as in the above description, a problem of gate leakage due to a tunnel effect or the like is caused. In order to solve the problem of gate leakage, the gate insulating layer 146 may be formed using a high dielectric constant (high-k) material such as hafnium oxide, tantalum oxide, yttrium oxide, hafnium silicate, hafnium silicate to which nitrogen is added, or hafnium aluminate to which nitrogen is added. By using a high-k material for the gate insulating layer 146, electrical characteristics can be ensured and the thickness can be large enough to prevent gate leakage. Note that a stacked structure of a film containing a high-k material and a film containing any one of silicon oxide, silicon nitride, silicon oxynitride, silicon nitride oxide, aluminum oxide, and the like may be employed.

Further, the insulating layer in contact with the oxide semiconductor layer 144 (in this embodiment, the gate insulating layer 146) may be an insulating material including a Group 13 element and oxygen. There are a great number of materials including a Group 13 element among oxide semiconductor materials, and an insulating material including a Group 13 element has a good compatibility with an oxide semiconductor. By using an insulating material including a Group 13 element for the insulating layer in contact with the oxide semiconductor layer, an interface with the oxide semiconductor layer can keep a favorable state.

An insulating material including a Group 13 element refers to an insulating material including one or more Group 13 elements. As the insulating material including a Group 13 element, a metal oxide such as gallium oxide, aluminum oxide, aluminum gallium oxide, and gallium aluminum oxide can be given for example. Here, aluminum gallium oxide refers to a material in which the amount of aluminum is larger than that of gallium in atomic percent, and gallium aluminum oxide refers to a material in which the amount of gallium is larger than or equal to that of aluminum in atomic percent.

For example, in forming a gate insulating layer in contact with an oxide semiconductor layer containing gallium, a material including gallium oxide may be used as a gate insulating layer, so that favorable characteristics can be kept at the interface between the oxide semiconductor layer and the gate insulating layer. When the oxide semiconductor layer and the insulating layer containing gallium oxide are provided in contact with each other, pileup of hydrogen at the interface between the oxide semiconductor layer and the insulating layer can be reduced, for example. Note that a similar effect can be obtained in the case where an element in the same group as a constituent element of the oxide semiconductor is used in an insulating layer. For example, it is effective to form an insulating layer with the use of a material including aluminum oxide. Note that aluminum oxide is impermeable property to water. Thus, it is preferable to use a material including aluminum oxide in terms of preventing entry of water to the oxide semiconductor layer.

The insulating material of the insulating layer in contact with the oxide semiconductor layer 144 preferably includes oxygen in a proportion higher than that in the stoichiometric composition (stoichiometric value), by heat treatment under an oxygen atmosphere or oxygen doping. "Oxygen doping" refers to addition of oxygen into a bulk. Note that the term "bulk" is used in order to clarify that oxygen is added not only to a surface of a thin layer but also to the inside of the thin layer. In addition, "oxygen doping" includes "oxygen plasma doping" in which oxygen which is made to be plasma is added to a bulk. The oxygen doping may be performed using an ion implantation method or an ion doping method.

For example, in a case where the insulating layer in contact with the oxide semiconductor layer 144 is formed of gallium oxide, the composition of gallium oxide can be set to be $Ga_2O_x$ (x=3+α, 0<α<1) by heat treatment under an oxygen atmosphere or oxygen doping. In a case where the insulating layer in contact with the oxide semiconductor layer 144 is formed of aluminum oxide, the composition of aluminum oxide can be set to be $Al_2O_x$ (x=3+α, 0<α<1) by heat treatment under an oxygen atmosphere or oxygen doping. In a case where the insulating layer in contact with the oxide semiconductor layer 144 is formed of gallium aluminum oxide (or aluminum gallium oxide), the composition of gallium aluminum oxide (or aluminum gallium oxide) can be set to be $Ga_xAl_{2-x}O_{3+\alpha}$ ($0<x<2$, $0<\alpha<1$) by heat treatment under an oxygen atmosphere or oxygen doping.

By oxygen doping or the like, an insulating layer which includes a region where the proportion of oxygen is higher than that in the stoichiometric composition can be formed. Since the insulating layer including such a region is in contact with the oxide semiconductor layer, oxygen that exists excessively in the insulating layer is supplied to the oxide semiconductor layer, and oxygen deficiency in the oxide semiconductor layer or at an interface between the oxide semiconductor layer and the insulating layer is reduced. Thus, the oxide semiconductor layer can be formed to an i-type or substantially i-type oxide semiconductor.

The insulating film which includes a region where the proportion of oxygen is higher than that in the stoichiometric composition may be applied to the insulating layer serving as a base film of the oxide semiconductor layer 144 instead of the gate insulating layer 146, or both the gate insulating layer 146 and the base insulating layer.

After the gate insulating layer 146 is formed, second heat treatment is desirably performed in an inert gas atmosphere or an oxygen atmosphere. The temperature of the heat treatment is set in the range of from 200° C. to 450° C., preferably from 250° C. to 350° C. For example, the heat treatment may be performed at 250° C. for 1 hour in a nitrogen atmosphere. The second heat treatment can reduce variation in electric characteristics of the transistor. Moreover, in a case where the gate insulating layer 146 includes oxygen, oxygen is supplied to the oxide semiconductor layer 144 to compensate oxygen deficiency in the oxide semiconductor layer 144, whereby an i-type (intrinsic) or substantially i-type oxide semiconductor layer can be formed.

Note that in this embodiment, the second heat treatment is performed after the gate insulating layer 146 is formed; the timing of the second heat treatment is not limited thereto. For example, the second heat treatment may be performed after the gate electrode is formed. Alternatively, the second heat treatment may follow the first heat treatment, the first heat treatment may double as the second heat treatment, or the second heat treatment may double as the first heat treatment.

As described above, at least one of the first heat treatment and the second heat treatment is applied, whereby the oxide semiconductor layer 144 can be highly purified as to minimize the amount of impurities that are not main components of the oxide semiconductor.

The gate electrode 148a and the electrode 148b can be formed in such a manner that a conductive layer is formed over the gate insulating layer 146 and then etched selectively. The conductive layer to serve as the gate electrode 148a and the electrode 148b can be formed by a PVD method typified by a sputtering method or a CVD method such as a plasma CVD method. The details are similar to those of the source electrode 142a or the like; thus, the description thereof can be referred to.

Figure 6A:
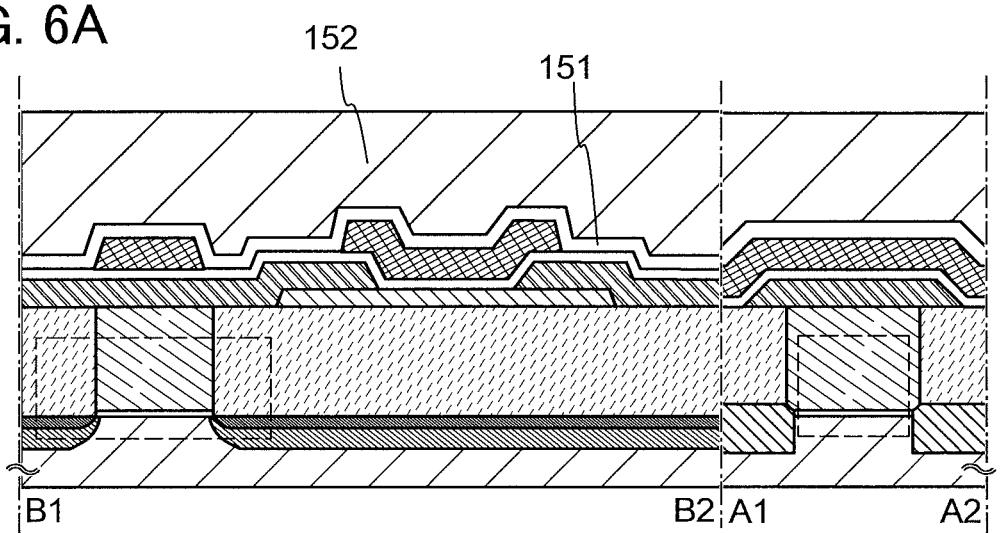
FIGS. 6A and 6B are cross-sectional views illustrating a manufacturing process of a semiconductor device.
Figure 6B:
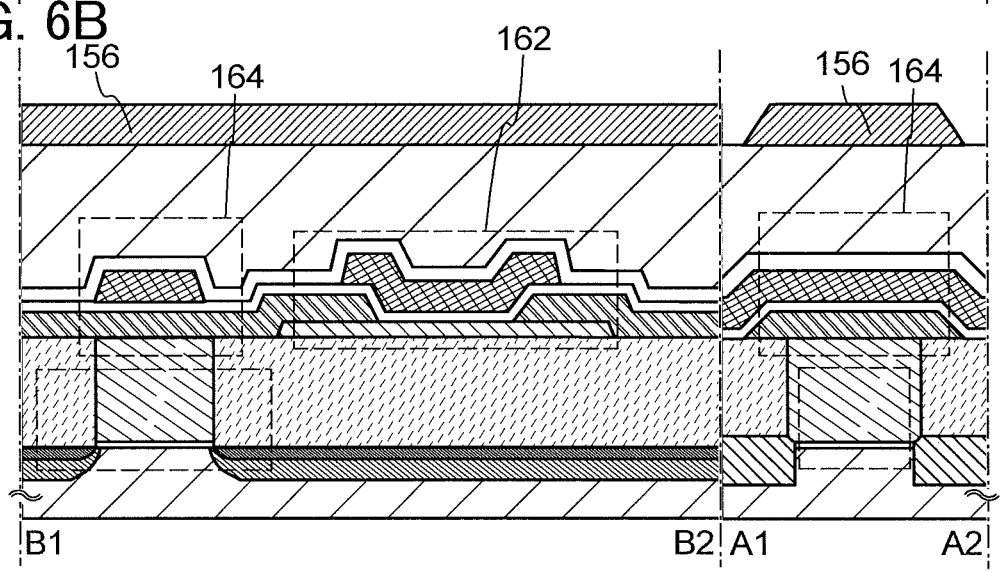

Next, the insulating layer 151 and the insulating layer 152 are formed over the gate insulating layer 146, the gate electrode 148a and the electrode 148b (see FIG. 6A). The insulating layer 151 and the insulating layer 152 can be formed by a PVD method, a CVD method, or the like. The insulating layer 151 and the insulating layer 152 can be formed using a material including an inorganic insulating material such as silicon oxide, silicon oxynitride, silicon nitride, hafnium oxide, or aluminum oxide.

Note that for the insulating layer 151 and the insulating layer 152, a material with a low dielectric constant may be preferably used or a structure with a low dielectric constant (e.g., a porous structure) may be preferably employed. This is because when the insulating layer 151 and the insulating layer 152 can be made to have a low dielectric constant, capacitance generated between wirings, electrodes, or the like can be reduced and higher speed operation can be achieved.

Note that although a stacked-layer structure of the insulating layer 151 and the insulating layer 152 is used in this embodiment, one embodiment of the disclosed invention is not limited to this example. A single-layer structure or a stacked structure including three or more layers can also be used. Alternatively, the insulating layers may be omitted.

Note that the insulating layer 152 is preferably formed so as to have a planarized surface. By forming the insulating layer 152 so as to have a planarized surface, an electrode, a wiring, or the like can be favorably formed over the insulating layer 152 even in a case where the semiconductor device is miniaturized, for example. The interlayer insulating layer 152 can be planarized by a method such as chemical mechanical polishing (CMP).

Then, an opening reaching the drain electrode 142b is formed in the gate insulating layer 146, the insulating layer 151, and the insulating layer 152. The opening is formed by selective etching with the use of a mask or the like. After that, the electrode (not shown) is formed in the opening, and the wiring 156 which is to be in contact with the electrode is formed over the insulating layer 152 (see FIG. 6B).

The electrode can be formed in such a manner that, for example, a conductive layer is formed by a PVD method, a CVD method, or the like in a region including the opening and then part of the conductive layer is removed by etching treatment, CMP, or the like.

The wiring 156 can be formed by forming a conductive layer by a PVD method such as a sputtering method, or a CVD method such as a plasma CVD method, and by patterning the conductive layer. As a material for the conductive layer, an element selected from the group of aluminum, chromium, copper, tantalum, titanium, molybdenum, and tungsten; an alloy containing any of these elements as a component; or the like can be used. Further, one material selected from the group of manganese, magnesium, zirconium, beryllium, neodymium and scandium or a combined material of some of these elements may be used. The details are similar to those of the source electrode 142a or the like.

Through the above process, the transistor 162 including the purified oxide semiconductor layer 144 and the capacitor 164 are completed.

Since the oxide semiconductor layer 144 is highly purified in the transistor 162 described in this embodiment, the hydrogen concentration is $5\times10^{19}$ atoms/cm$^3$ or lower, preferably $5\times10^{18}$ atoms/cm$^3$ or lower, more preferably $5\times10^{17}$ atoms/cm$^3$ or lower. In addition, the value of the carrier concentration of the oxide semiconductor layer 144 is much lower (e.g., lower than $1\times10^{12}$/cm$^3$, preferably lower than $1.45\times10^{10}$/cm$^3$) than that of a general silicon wafer (approximately $1\times10^{14}$/cm$^3$). Accordingly, the off-state current of the transistor 162 is also sufficiently small. For example, the off-state current (here, current per micrometer (μm) of channel width) at room temperature (25° C.) is 100 zA to lower (1 zA (zeptoampere) is $1\times10^{-21}$ A), preferably 10 zA or lower.

With the use of the highly purified intrinsic oxide semiconductor layer 144, the off-state current of the transistor can be sufficiently reduced easily. Then, by using such a transistor, a semiconductor device in which stored data can be held for an extremely long time can be obtained.

As for the semiconductor device described in this embodiment, the source electrode 142a includes the third region 200c extending from the gate electrode 110 toward the side opposite to the oxide semiconductor layer 144 (on the source line SL side) in the transistor 162_m included in the memory cell of the last row (the m-th row). Thus, in the memory cells of the first to the m-th rows, the parasitic capacitances generated in the connection portions (nodes FG) where the source electrode 142a and the gate electrode 110 are electrically connected can be close to each other, or preferably substantially equal. Accordingly, variation of the electric potentials in the nodes FG of the memory cells of the first to the m-th rows can be suppressed, and thereby the semiconductor device capable of a stable operation can be provided.

The methods and structures described in this embodiment can be combined as appropriate with any of the methods and structures described in the other embodiments.

Embodiment 2

In this embodiment, electronic devices to which the semiconductor device described in Embodiment 1 is applied to will be described with reference to FIGS. 10A to 10F. In this embodiment, the above-described semiconductor device is applied to electronic devices such as computers, mobile phone sets (also referred to as mobile phones o mobile phone devices), portable information terminals (including portable game machines, audio reproducing devices, and the like), digital cameras, digital video cameras, electronic paper, television sets (also referred to as televisions or television receivers), and the like.

Figure 10A:
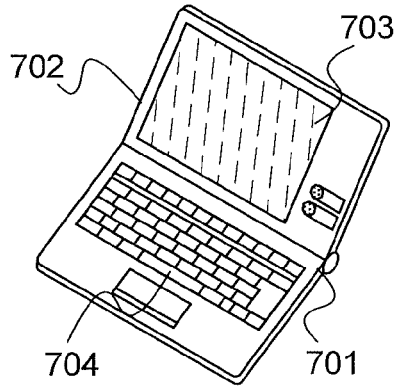
FIGS. 10A to 10F are diagrams each illustrating an electronic device which includes a semiconductor device.

FIG. 10A illustrates a notebook personal computer, which includes a housing 701, a housing 702, a display portion 703, a keyboard 704, and the like. The semiconductor device described in Embodiment 1 is provided in at least one of the housings 701 and 702. Thus, a notebook personal computer with sufficiently low power consumption, in which writing and reading of data can be performed at high speed and data can be stored for a long time, can be realized.

Figure 10D:
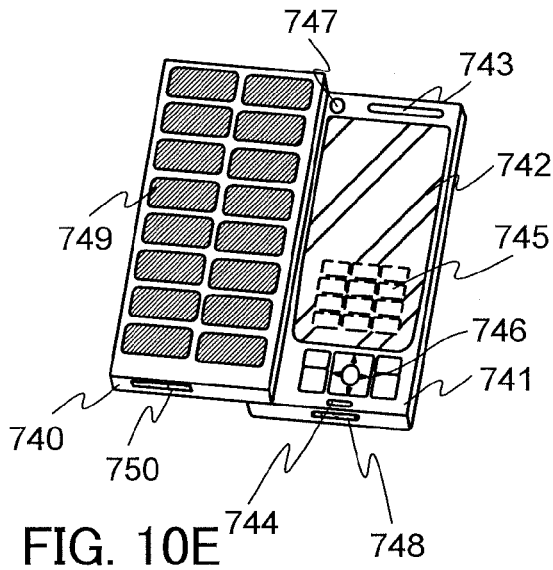
Figure 10B:
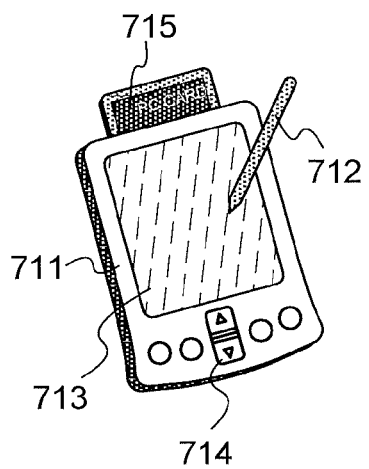

FIG. 10B illustrates a portable information terminal (PDA). A main body 711 is provided with a display portion 713, an external interface 715, operation buttons 714, and the like. Further, a stylus 712 for operation of the portable information terminal, or the like is provided. The semiconductor device described in Embodiment 1 is provided in the main body 711. Thus, a portable information terminal with sufficiently low power consumption, in which writing and reading of data can be performed at high speed and data can be stored for a long time, can be realized.

Figure 10E:
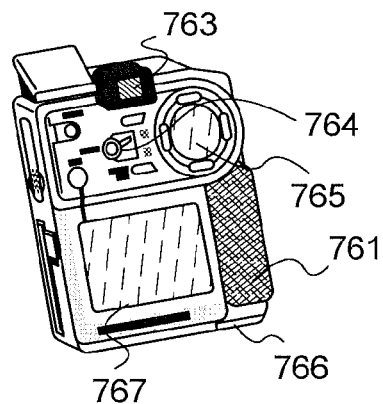
Figure 10C:
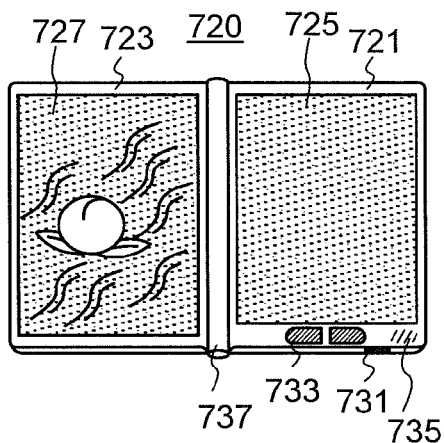

FIG. 10C illustrates an electronic book 720 incorporating electronic paper, which includes two housings, a housing 721 and a housing 723. The housing 721 and the housing 723 include a display portion 725 and a display portion 727, respectively. The housing 721 is connected to the housing 723 by a hinge 737, so that the electronic book can be opened and closed using the hinge 737 as an axis. In addition, the housing 721 is provided with a power switch 731, operation keys 733, a speaker 735, and the like. At least one of the housings 721 and 723 is provided with the semiconductor device described in Embodiment 1. Thus, an electronic book with sufficiently low power consumption, in which writing and reading of data can be performed at high speed and data can be stored for a long time, can be realized.

FIG. 10D illustrates a mobile phone set, which includes two housings, a housing 740 and a housing 741. Moreover, the housings 740 and 741, which are developed as illustrated in FIG. 10D, can be slid so that one is lapped over the other. Therefore, the size of the mobile phone set can be reduced, which makes the mobile phone set suitable for being carried around. The housing 741 includes a display panel 742, a speaker 743, a microphone 744, operation keys 745, a pointing device 746, a camera lens 747, an external connection terminal 748, and the like. The housing 740 includes a solar cell 749 for charging the mobile phone set, an external memory slot 750, and the like. An antenna is incorporated in the housing 741. The semiconductor device described in Embodiment 1 is provided in at least one of the housings 740 and 741. Thus, a mobile phone set with sufficiently low power consumption, in which writing and reading of data can be performed at high speed and data can be stored for a long time, can be realized.

FIG. 10E illustrates a digital camera, which includes a main body 761, a display portion 767, an eyepiece 763, an operation switch 764, a display portion 765, a battery 766, and the like. The semiconductor device described in Embodiment 1 is provided in the main body 761. Thus, a digital camera with sufficiently low power consumption, in which writing and reading of data can be performed at high speed and data can be stored for a long time, can be realized.

Figure 10F:
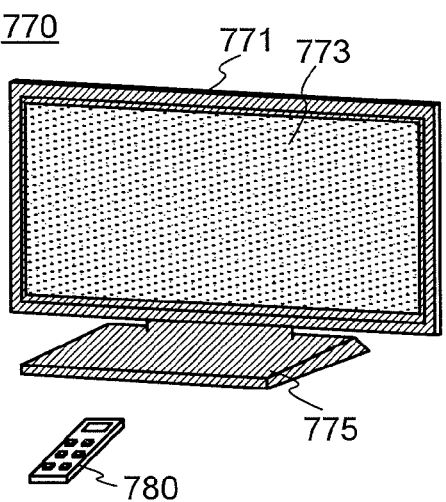

FIG. 10F is a television set 770, which includes a housing 771, a display portion 773, a stand 775, and the like. The television set 770 can be operated with a switch included in the housing 771 or with a remote controller 780. The semiconductor device described in Embodiment 1 is mounted in the housing 771 and the remote controller 780. Thus, a television set with sufficiently low power consumption, in which writing and reading of data can be performed at high speed and data can be stored for a long time, can be realized.

As described above, the electronic devices described in this embodiment each include the semiconductor device according to Embodiment 1. Therefore, electronic devices with low power consumption can be realized.

EXPLANATION OF REFERENCE

100: substrate, 102: protective layer, 104 semiconductor region, 106: element isolation insulating layer, 108: gate insulating layer, 110: gate electrode, 116: channel formation region, 120: impurity region, 122: metal layer, 124: metal compound region, 126: electrode, 128: insulating layer, 138: wiring, 140: electrode, 142a: source electrode, 142b: drain electrode, 144: oxide semiconductor layer, 146: gate insulating layer, 148a: gate electrode, 148b: electrode, 150: insulating layer, 151: insulating layer, 152: insulating layer, 154: electrode, 156: wiring, 160: transistor, 162: transistor, 164: capacitor, 170: memory cell, 180: selection transistor, 200a: first region, 200b: second region, 200c: third region, 200d: fourth region, 200e: fifth region, 701: casing, 702: casing, 703: display portion, 704: keyboard, 711: main body, 712: stylus, 713: display portion, 714: operation button, 715: external interface, 720: electronic book, 721: casing, 723: casing, 725: display portion, 727: display portion, 731: power switch, 733: operation key, 735: speaker, 737: hinge, 740: casing, 741: casing, 742: display panel, 743: speaker, 744: microphone, 745: operation key, 746: pointing device, 747: camera lens, 748: external connection terminal, 749: solar cell, 750: external memory slot, 761: main body, 763: eyepiece, 764: operation switch, 765: display portion, 766: battery, 767: display portion, 770: television set, 771: casing, 773: display portion, 775: stand, 780: remote controller, This application is based on Japanese Patent Application serial no. 2010-162134 filed with Japan Patent Office on Jul. 16, 2010, the entire contents of which are hereby incorporated by reference.

The invention claimed is:

1. A semiconductor device comprising m (m is an integer of 2 or more) write word lines, m read word lines, a bit line, a source line, a signal line and a first to an m-th memory cells connected in series between the bit line and the source line,
the first to the m-th memory cells each comprising:
a first transistor including a first gate electrode, a first source electrode, a first drain electrode and a first channel formation region;
a second transistor including a second gate electrode, a second source electrode, a second drain electrode and a second channel formation region; and
a capacitor,
wherein the first channel foil cation region includes a semiconductor material different from a semiconductor material of the second channel formation region,
wherein in each of the first to the m-th memory cells, the first gate electrode, either the second source electrode or the second drain electrode, and one electrode of the capacitor are electrically connected to form a node of which electric charges are held, and
wherein a parasitic capacitance of the node included in the m-th memory cell is half of or more than half of a parasitic capacitance of the node included in an i (i is an integer of from 1 to (m−1))-th memory cell.

2. The semiconductor device according to claim 1, wherein the first channel formation region includes silicon, and the second channel formation region includes an oxide semiconductor.

3. A semiconductor device comprising m (m is an integer of 2 or more) write word lines, m read word lines, a bit line, a source line, a signal line and a first to an m-th memory cells connected in series between the bit line and the source line,
the first to the m-th memory cells each comprising:
a first transistor including a first gate electrode, a first source electrode, a first drain electrode and a first channel formation region;
a second transistor including a second gate electrode, a second source electrode, a second drain electrode and a second channel formation region; and
a capacitor,
wherein the first channel formation region includes a semiconductor material different from a semiconductor material of the second channel formation region,
wherein in each of the first to the m-th memory cells, the first gate electrode, either the second source electrode or the second drain electrode, and one electrode of the capacitor are electrically connected to form a node of which electric charges are held, and
wherein parasitic capacitances of the nodes included in the first to the m-th memory cells are substantially equal.

4. The semiconductor device according to claim 3, wherein the first channel formation region includes silicon, and the second channel formation region includes an oxide semiconductor.

5. A semiconductor device comprising m (m is an integer of 2 or more) write word lines, m read word lines, a bit line, a source line, a signal line and a first to an m-th memory cells connected in series between the bit line and the source line,
the first to the m-th memory cells each comprising:
a first transistor including a first gate electrode, a first source electrode, a first drain electrode and a first channel formation region;
a second transistor including a second gate electrode, a second source electrode, a second drain electrode and a second channel formation region; and
a capacitor,
wherein the first channel formation region includes a semiconductor material different from a semiconductor material of the second channel formation region,
wherein the second transistor overlaps with at least a part of the first transistor with an insulating layer therebetween,
wherein either the second source electrode or the second drain electrode is over and in contact with the first gate electrode,
wherein either the second source electrode or the second drain electrode includes a first region in contact with the first gate electrode, a second region extending from the first gate electrode toward the second channel formation region, and a third region extending from the gate electrode in a direction opposite to the second channel formation region, and
wherein a parasitic capacitance between the third region and the first transistor in the m-th memory cell is substantially equal to a parasitic capacitance between the third region and the first transistor in an i (i is an integer of from 1 to (m−1))-th memory cell.

6. The semiconductor device according to claim 5, wherein lengths in a channel length direction of the second source electrodes in the first to the m-th memory cells are equal.

7. The semiconductor device according to claim 5,
the second source electrode in the m-th memory cell further comprising:
a fourth region, which is a part of the second region and overlaps with the second gate electrode, and
a fifth region, which is a part of the third region and overlaps with the source line,
wherein a parasitic capacitance between the fifth region and the source line is substantially equal to a parasitic capacitance between the second source electrode in the (m−1)-th memory cell and the second gate electrode in the m-th memory cell.

8. The semiconductor device according to claim 7, wherein a length in a channel length direction of the fifth region is equal to a length in a channel length direction of a region where the second source electrode in the (m−1)-th memory cell overlaps with the second gate electrode of the m-th memory cell.

9. The semiconductor device according to claim 5, wherein the first channel formation region includes silicon, and the second channel formation region includes an oxide semiconductor.

* * * * *